(12) United States Patent
Kang et al.

(10) Patent No.: US 11,621,038 B2
(45) Date of Patent: Apr. 4, 2023

(54) DRIVER FOR NON-BINARY SIGNALING

(71) Applicant: Micron Technology, Inc., Boise, ID (US)

(72) Inventors: Shindeok Kang, Boise, ID (US); Timothy M. Hollis, Meridian, ID (US); Dragos Dimitriu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/381,860

(22) Filed: Jul. 21, 2021

(65) Prior Publication Data

US 2023/0027926 A1 Jan. 26, 2023

(51) Int. Cl.

| G11C 11/56 | (2006.01) |
|---|---|
| G11C 7/02 | (2006.01) |
| G11C 5/14 | (2006.01) |
| G11C 7/24 | (2006.01) |

(52) U.S. Cl.
CPC ............... *G11C 11/56* (2013.01); *G11C 7/02* (2013.01); *G11C 5/147* (2013.01); *G11C 7/24* (2013.01); *G11C 2207/2254* (2013.01)

(58) Field of Classification Search
CPC .. G11C 11/56; G11C 5/14; G11C 7/02; G11C 7/24; G11C 2207/2254
USPC ........................................................ 365/206
See application file for complete search history.

(56) References Cited

U.S. PATENT DOCUMENTS

| 7,514,954 B2* | 4/2009 | Kim ..................... G11C 7/1051 |
|---|---|---|
| | | 365/189.11 |
| 7,646,215 B2* | 1/2010 | Haig .................. H03K 19/0005 |
| | | 326/87 |
| 8,395,412 B2* | 3/2013 | Osanai ............... H03K 19/0005 |
| | | 326/87 |
| 8,531,206 B2* | 9/2013 | Amirkhany ......... H04L 25/0278 |
| | | 326/27 |
| 9,166,565 B2* | 10/2015 | Brunolli .............. H04L 25/0278 |
| 9,324,410 B2* | 4/2016 | Arai ..................... G11C 29/028 |
| 9,825,631 B1* | 11/2017 | Cho .................... G11C 11/4093 |
| 2011/0163778 A1 | 7/2011 | Moon |
| 2017/0331476 A1 | 11/2017 | Cho et al. |
| 2019/0004919 A1 | 1/2019 | McCall et al. |

(Continued)

FOREIGN PATENT DOCUMENTS

KR   10-2009-0121470 A   11/2009

OTHER PUBLICATIONS

"International Search Report and Written Opinion of the International Searching Authority," issued in connection with Int'l Appl. No. PCT/US2022/073716 dated Nov. 1, 2022 (9 pages).

*Primary Examiner* — Son L Mai

(74) *Attorney, Agent, or Firm* — Holland & Hart, LLP

(57) ABSTRACT

Methods, systems, and devices related to an improved driver for non-binary signaling are described. A driver for a signal line may include a set of drivers of a first type and a set of drivers of a second type. When the driver drives the signal line using multiple drivers of the first type, at least one additional driver of the first type may compensate for non-linearities associated with one or more other drivers of the first type, which may have been calibrated at other voltages. The at least one additional driver of the first type may be calibrated for use at a particular voltage, to compensate for non-linearities associated with the one or more other drivers of the first type as exhibited at that particular voltage.

19 Claims, 8 Drawing Sheets

(56) References Cited

U.S. PATENT DOCUMENTS

2019/0027205 A1 1/2019 Hollis et al.
2020/0066309 A1 2/2020 Mayer et al.

* cited by examiner

DRIVER FOR NON-BINARY SIGNALING

FIELD OF TECHNOLOGY

The following relates generally to one or more systems for memory and more specifically to improved driver for non-binary signaling.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
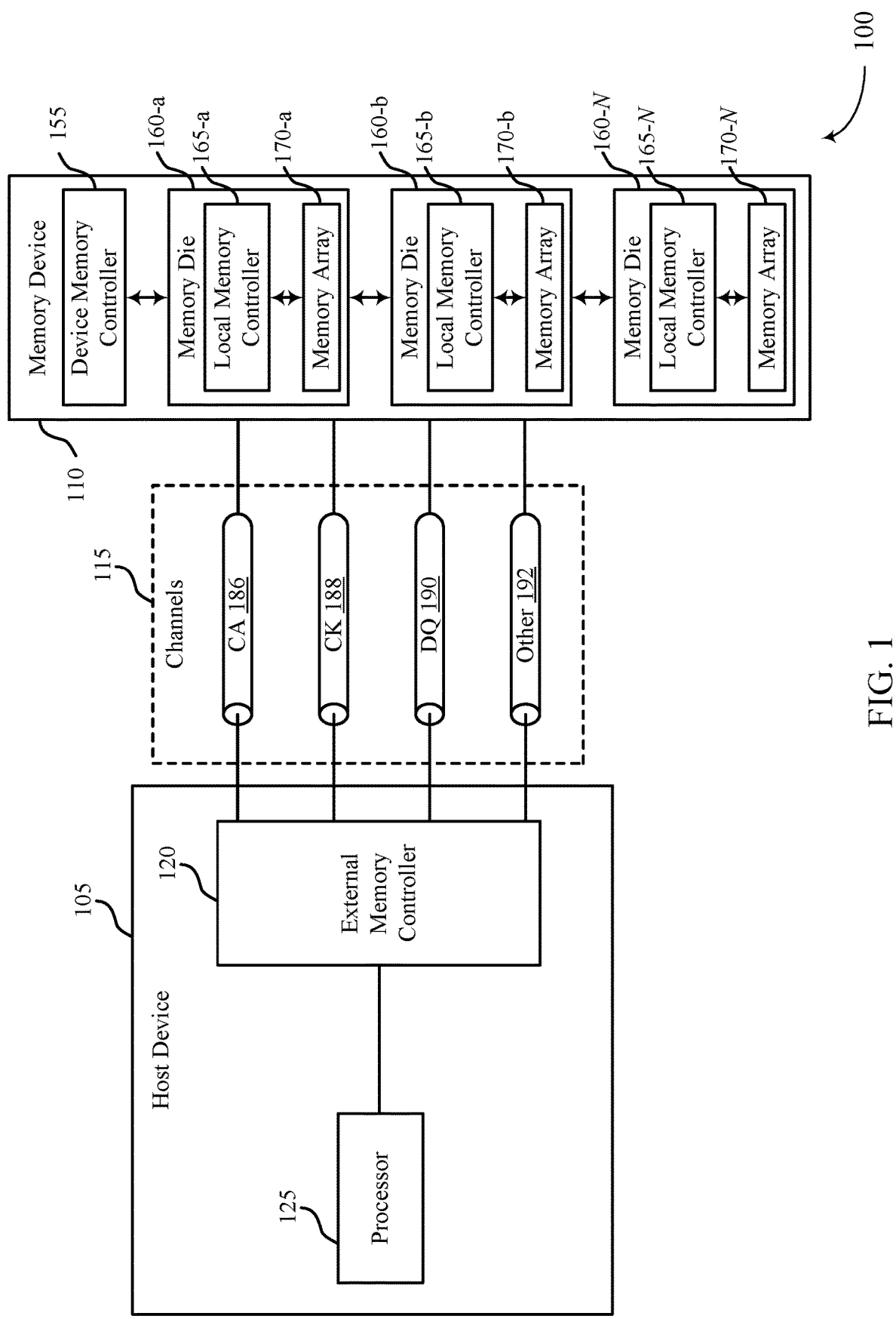
FIG. 1 illustrates an example of a system that supports an improved driver for non-binary signaling in accordance with examples as disclosed herein.

A memory device may be used to store data for a host device in an electronic system. In some examples, the memory device may exchange (e.g., transmit or receive) signaling with the host device (e.g., signaling representative of data to be written to the memory device or data read from the memory device). To generate the signaling, the memory device may include drivers to drive signal lines to different voltages (e.g., target voltages), where a voltage on a signal line may represent one or more bits of information. For example, four target voltages may be used, each of which may represent two bits of information (e.g., a first voltage on a signal line may represent two bits corresponding to a logic value of 00, a second voltage on the signal line may represent two bits corresponding to a logic value of 01, a third voltage on the signal line may represent two bits corresponding to a logic value of 10, and a fourth voltage on the signal line may represent two bits corresponding to a logic value of 11. A receiver may identify the voltage on the signal line (e.g., may identify that the voltage of the signal line is within a voltage range) and thus identify the one or more bits of information represented by the voltage (e.g., may identify two bits corresponding to a logic value of 00 if the voltage of the signal line is within a first voltage range that includes the first voltage, may identify two bits corresponding to a logic value of 01 if the voltage of the signal line is within a second voltage range that includes the second voltage, and so on).

In some examples, a driver (e.g., a pull-up or pull-down driver) may be calibrated at a first voltage but may also be used (e.g., in combination with one or more other pull-up or pull-down drivers) to drive a signal line to one or more other voltages. In such examples, when the driver is also used to drive the signal line to one of the other voltages, the driver may have a different impedance than the calibrated impedance it has at the first voltage. As used herein, an impedance of a driver may reference to an output impedance of the driver when the driver is activated (e.g., used to drive a signal line). For example, a pull-up driver calibrated at a first voltage may have a first impedance when used to drive the signal line to the first voltage, but the same pull-up driver may have a second impedance when used to drive the signal line the second voltage. Such behavior may relate to a non-linearity of the driver (e.g., an output impedance of the driver may vary in non-linear fashion as a function of the driver's output voltage). In some examples, variations in the impedance of a driver when operated at different voltages may cause the margins between the different voltages associated with a signaling scheme, which may alternative be referred to as a modulation scheme (e.g., a pulse amplitude modulation (PAM) scheme), to vary from one voltage to another. For example, in a signaling scheme in which four voltages are used, a difference between the first voltage and the second voltage may be different than a difference between the second voltage and the third voltage, which may in turn be different than a difference between the third voltage and the fourth voltage. Such variances may impact the ability of a receiving device to correctly de-serialize (e.g., decode, interpret) signaling generated by the driver. For example, the margin (e.g., window, difference) between some adjacent voltages within the modulation scheme may be undesirably narrow due to the non-linearity of one or more drivers.

As described herein, a driver that drives a signal line in accordance with a non-binary signaling scheme (e.g., a signaling scheme associated with three or more voltages) may, for example, include a set of pull-down drivers and a set of pull-up drivers where the set of pull-up drivers has one or more additional drivers compared with the set of pull-down drivers. In such examples, the one or more additional pull-up drivers may be activated concurrently with at least one (e.g., each) driver of the set of pull-up drivers to signal a voltage of the three or more voltages, which may compensate for non-linearities associated with the other drivers of the set of pull-up drivers, as such other drivers may have been calibrated at different voltages. For example, the other pull-up drivers may each be used individually, with no other pull-up drivers of the set activated, at a respective one of those other voltages, and hence the memory device may calibrate each of the other pull-up drivers at the respective voltage at which it is used.

As one illustrative example, a memory device may include a first pull-up driver and a second pull-up driver in a set of pull-up drivers. In some examples, the memory device may be memory device comprising DRAM memory cells. In other examples, the memory device may comprise memory cells of a different type. The memory device may calibrate the first pull-up driver to have a first impedance at a first voltage of the three or more voltages and use the first driver to signal the first voltage (e.g., with no other pull-up drivers activated). Further, the memory device may calibrate the second pull-up driver to have a second impedance at a second voltage of the three or more voltages and use the second driver to signal the second voltage (e.g., with no other pull-up drivers activated). In such examples, the memory device may calibrate the one or more additional pull up drivers concurrently with the first pull-up driver and the second pull-up driver at a third voltage of the one or more voltages. When used to drive the signal line to the third voltage, the first pull-up driver and the second pull-up driver may both have impedances that deviate from their respective calibrated impedances (e.g., due to non-linearities of the first pull-up driver and the second pull-up driver), but the impedance of the third pull-driver may compensate for such deviations as its impedance may have been calibrated while operated at the third voltage and in conjunction with (e.g., in parallel with) the first pull-up driver and the second pull-up driver. For example, the collective impedance of the first pull-up driver, second pull-up driver, and third pull-up driver when operated in parallel at the third voltage may be equal to (or at least more equal to) the calibrated impedance of the first pull-up driver in parallel with the calibrated impedance of the second pull-up driver. By utilizing the one or more additional pull-up drivers, the memory device may maintain a reliable margin between each voltage of the three or more voltages and transmit data more effectively.

Though certain examples may be explained herein in the context of utilizing at least one additional pull-up driver calibrated for use in conjunction with one or more other pull-up drivers, it is to be understood that the teachings herein may additionally or alternatively be applied to pull-down drivers. For example, a driver may include a set of pull-up driver and a set of pull-down drivers where the set of pull-down drivers has one or more additional drivers compared with the set of pull-up drivers. In such examples, the one or more additional pull-down drivers may be activated concurrently with at least one (e.g., each) driver of the set of pull-down drivers to signal a voltage of the three or more voltages, which may compensate for non-linearities associated with the other drivers of the set of pull-down drivers, as such other drivers may have been calibrated at different voltages. As another example, a driver in accordance with the teaching herein may include an equal quantity of pull-up drivers and pull-down drivers, with at least one pull-up driver calibrated for use in conjunction with one or more of the other pull-up drivers, and with at least one pull-down driver calibrated for use in conjunction with one or more of the other pull-down drivers Further, though certain examples may be explained herein in the context of drivers included in memory devices, is to be understood that the teachings herein may additionally or alternatively be applied to drivers included in any type of electronic device.

Features of the disclosure are initially described in the context of systems and dies as described with reference to FIG. 1. Features of the disclosure are described in the context of drivers, flow diagrams, and circuits as described with reference to FIGS. 2-5 These and other features of the disclosure are further illustrated by and described with reference to an apparatus diagram and flowcharts that relate to improved driver for non-binary signaling as described with reference to FIGS. 7 and 8.

FIG. 1 illustrates an example of a system 100 that supports improved driver for non-binary signaling in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel. A signal path may be an example of a signal line as described herein.

Some channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a non-binary (or multi-level) modulation scheme may be used to modulate signals communicated between the host device 105 and the memory device 110. A non-binary modulation scheme may be an example of a M-ary modulation scheme where M is greater than or equal to three. Each symbol of a non-binary modulation scheme may be operable to represent more than one bit of digital data (e.g., a symbol may represent a logic 00, a logic 01, a logic 10, or a logic 11). Examples of non-binary modulation schemes include, but are not limited to, PAM3, PAM4, PAM8, etc., quadrature amplitude modulation (QAM), quadrature phase shift keying (QPSK), and/or others. A non-binary signal (e.g., a PAM3 signal or a PAM4 signal) may be a signal that is modulated using a modulation scheme that includes at least three levels to encode more than one bit of information. non-binary modulation schemes and symbols may alternatively be referred to as non-binary, multi-bit, multi-level, multi-symbol, or higher-order modulation schemes and symbols. A voltage of a signal line may be an example of a non-binary symbol, where three or more target (e.g., candidate) voltage levels are associated with the modulation scheme. For example, where four target voltage levels are used, a voltage of a signal line may be an example of a PAM4 symbol.

A memory device 110 (or host device 105) may include any quantity of drivers each configured to drive a respective signal line (e.g., as included in a channel 115). For example, a memory die 160 may include such drivers. In some cases, a driver may be configured to drive a corresponding signal line to three or more voltages (e.g., representative of data read from or to be written to a memory array 170), in accordance with a non-binary modulation scheme. For example, the driver may include a set of one or more pull-down drivers and a set of one or more pull-up drivers. One or more of the pull-up drivers may be activated individually (e.g., while no other pull-up drivers are activated) to drive the signal line to different respective voltages, and these one or more pull-up drivers may each have a calibrated impedance when operated at their respective voltages. An additional pull-up driver may be activated in conjunction with (e.g., concurrently with) at least one (e.g., each) of these one or more pull-up drivers to drive the signal line to an additional voltage, and the additional pull-up driver may be calibrated so as to, in combination with the one or more other concurrently activated pull-up drivers, achieve a desired collective impedance at the additional voltage. By utilizing and so calibrating the additional driver, the memory device 110 may offset impedance deviations of the one or more other concurrently activated pull-up drivers from their calibrated impedance, such as deviations resulting from those one or more other concurrently activated pull-up drivers having been calibrated at one or more other voltages different than the voltage at which the additional driver is used. Accordingly, non-linearities associated with the one or more other individual drivers may be compensated for, and the memory device 110 may transmit signals more accurately (e.g., may drive the signal line to voltages equal to or more equal to the target voltages of the modulation scheme).

Figure 2:
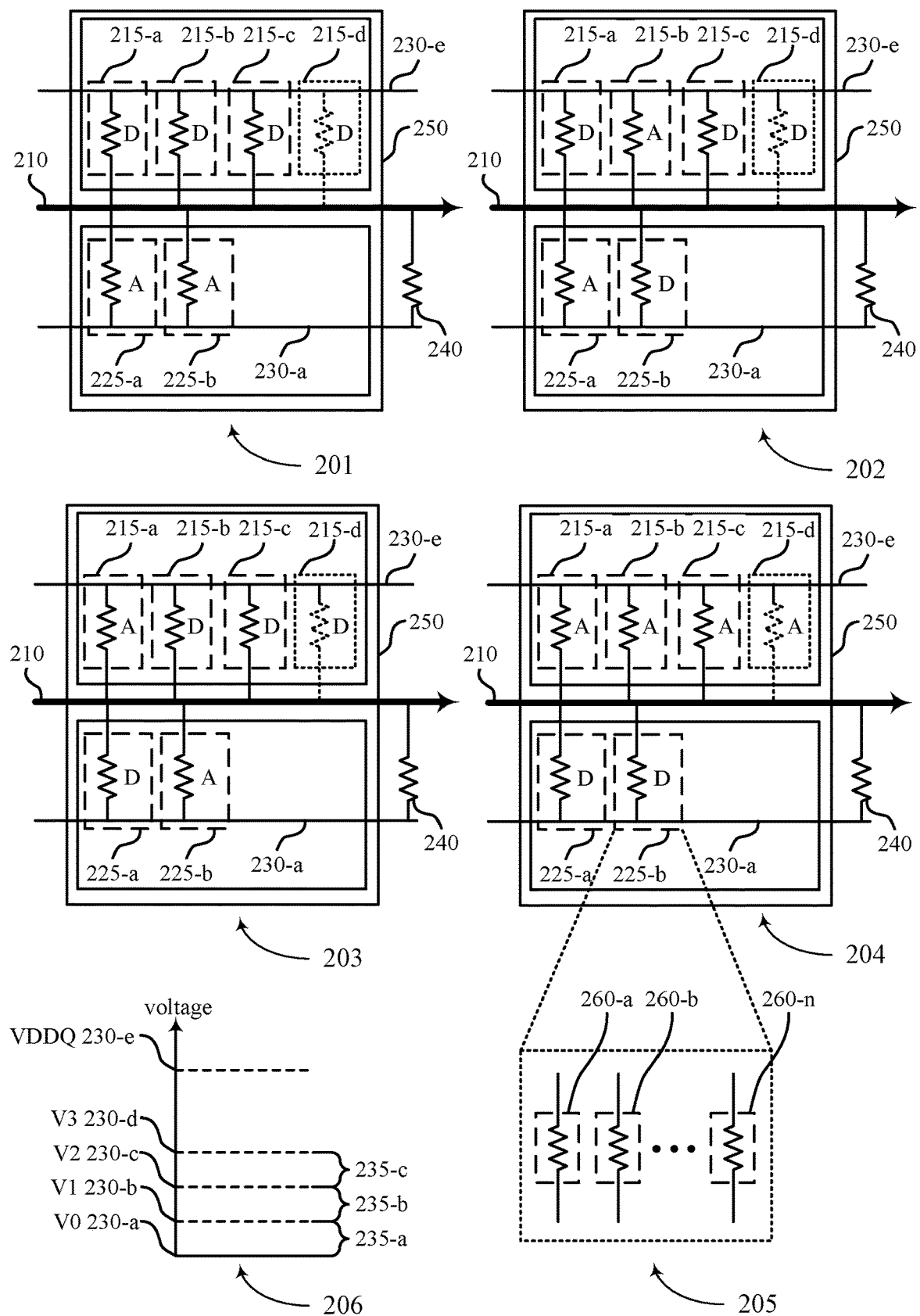
FIG. 2 illustrates examples of circuits that support an improved driver for non-binary signaling in accordance with examples as disclosed herein.

FIG. 2 illustrates example circuit and voltage diagrams for a circuit that supports thermometer coding for driving non-binary signals in accordance with examples as disclosed herein. For example, FIG. 2 includes circuit diagrams 201, 202, 203, 204, and 205, along with voltage diagram 206. The circuit diagrams 201, 202, 203, and 204 each illustrate a same driver 250, which may be configured to drive to a signal line 210 to a set of different target voltages, and where the example target voltages are illustrated in voltage diagram 206. The driver 250 may, for example, be included in a memory device 110 as described with reference to FIG. 1 (e.g., may be included in a memory die 160). The signal line 210 may, for example, be included in or be an example of a channel 115 as described with reference to FIG. 1. The circuit diagram 205 indicates components that may be included in a pull-up driver 215 or pull-down driver 225 within the driver 250.

The signal line 210 may be associated with a termination impedance 240. The driver 250 may be configured to be impedance-matched with the termination impedance 240. The termination impedance 240 may be at an opposite end of the signal line as the driver 250 (e.g., the termination impedance 240 may be included a receiving device or may be coupled with the signal line 210 at a location along the signal line 210 that is between the driver 250 and the receiving device). In some examples, the termination impedance 240 may represent an effective impedance of the signal line 210 as observed from the perspective of the driver 250.

The voltage diagram 206 illustrates a first voltage 230-$a$ (which may be referred to as V0), a second voltage 230-$b$ (which may be referred to as V1), a third voltage 230-$c$ (which may be referred to as V2), a fourth voltage 230-$d$ (which may be referred to as V3). V0, V1, V2, and V3 may be examples of target voltages in accordance with a signaling scheme, such as target voltages in accordance with a PAM4 signaling scheme. In some examples, V0 may be equal to the voltage of a lower voltage supply or reference, which may be referred to as VSS. The voltage diagram 206 also illustrates a voltage VDDQ 230-$e$, which may be the voltage of an upper voltage supply or reference. Where VSS and V0 are 0V, for example, V3 may be equal to one half (three sixths) of VDDQ, V2 may be equal to one third (two sixths) of VDDQ, and V1 may be equal to one sixth of VDDQ. Hence, a voltage margin 235-$a$ between V0 and V1 may be equal to one sixth of VDDQ, a voltage margin 235-$b$ between V1 and V2 may also be equal to one sixth of VDDQ, and a voltage margin 235-$c$ between V2 and V3 may also be equal to one sixth of VDDQ.

It is to be understood that any specific numeric examples described herein are provided solely for the sake of clarity in explanation and are not limiting of the claims. It is similarly to be understood that any specific quantities described herein (e.g., quantities of pull-up drivers 215, quantities of pull-down drivers 225) are provided solely for the sake of clarity in explanation and are not limiting of the claims.

The driver 250 may include a set of pull-up drivers 215 and a set of pull-down drivers 225. Circuit diagram 201 may illustrate operation of the driver 250 when the driver 250 is used to drive the signal line 210 to V0, circuit diagram 202 may illustrate operation of the driver 250 when the driver 250 is used to drive the signal line 210 to V1, circuit diagram 203 may illustrate operation of the driver 250 when the driver 250 is used to drive the signal line 210 to V2, and circuit diagram 204 may illustrate operation of the driver 250 when the driver 250 is used to drive the signal line 210 to V3. The driver 250 may drive the signal line to different voltages (e.g., the voltages of voltage diagram 206) to represent data stored at a memory device (e.g., within a memory array of the memory device).

Each pull-down driver 225 may be coupled with the signal line 210 and with the lower voltage supply or reference, VSS, which may be equal in voltage to V0. When activated, each pull-down driver 225 may be configured to couple the signal line 210 with VSS with a certain amount of impedance. Conversely, each pull-up driver 215 may be coupled with the upper voltage supply or reference, VDDQ. And when activated, each pull-up driver 215 may be configured to couple the signal line 210 with VDDQ with a certain amount of impedance. For example, the upper terminal (as illustrated) of each pull-up driver 215 may be coupled with VDDQ, and the lower terminal (as illustrated) of each pull-down driver 225 may be coupled with VSS. In the example illustrated in FIG. 2, the termination impedance 240 is coupled with VSS, but it is to be understood that the termination impedance 240 may be coupled with VDDQ in other examples.

When the driver 250 is operated as shown in circuit diagram 201 (with both pull-down drivers 225 activated and all pull-up drivers 215 deactivated), the driver 250 may drive the signal line 210 to V0 as the impedance between the signal line 210 and VDDQ may be very large (e.g., effectively infinite), while the impedance between the signal line 210 and VSS may be relatively small. The two pull-down drivers 225 may be configured such that, when activated in parallel as in circuit diagram 201, the combined impedance of the two pull-down drivers 225 is equal to the impedance of the termination impedance 240.

When the driver 250 is operated as shown in circuit diagram 202 (with the first pull-down driver 225-a activated and the second pull-up driver 215-b activated, and all other pull-down drivers 225 and pull-up drivers 215 deactivated), the driver 250 may drive the signal line 210 to V1 as the impedance between the signal line 210 and VDDQ may be five times larger than the impedance between the signal line 210 and VSS, thereby creating a voltage divider with a one sixth ratio. Further, the first pull-down driver 225-a and the second pull-up driver 215-b may be configured such that, when activated as in circuit diagram 202, the combined impedance of the first pull-down driver 225-a and the first pull-up driver 215-a (considered to be in parallel) is equal to the impedance of the termination impedance 240.

When the driver 250 is operated as shown in circuit diagram 203 (with the second pull-down driver 225-b activated, the first pull-up driver 215-a activated, and all other pull-down drivers 225 and pull-up drivers 215 deactivated), the driver 250 may drive the signal line 210 to V2 as the impedance between the signal line 210 and VDDQ may be two times larger than the impedance between the signal line 210 and VSS, thereby creating a voltage divider with a one third ratio. Further, the second pull-down driver 225-b and the first pull-up driver 215-a may be configured such that, when activated as in circuit diagram 203, the combined impedance of the second pull-down driver 225-b, first pull-up driver 215-a, and second pull-up driver 215-b (considered to be in parallel) is equal to the impedance of the termination impedance 240.

When the driver 250 is operated as shown in circuit diagram 204 (with both pull-down drivers 225 deactivated and all pull-up drivers 215 activated), the driver 250 may drive the signal line 210 to V3 as the impedance between the signal line 210 and VDDQ may be equal to the impedance between the signal line 210 and VSS, thereby creating a voltage divider with a one half ratio. Further, the first pull-up driver 215-a, the second pull-up driver 215-b, and the third pull-up driver 215-c may be configured such that, when activated in parallel as in circuit diagram 204, the combined impedance of the first pull-up driver 215-a, second pull-up driver 215-b, and third pull-up driver 215-c is equal to the impedance of the termination impedance 240.

Each pull-up driver 215 and pull-down driver 225 may include a respective quantity of driver elements 260, which may alternatively be referred to as driver legs. Circuit diagram 205, shown as a blowout of the second pull-down driver 225-b as illustrated in circuit diagram 204, may be representative of the driver elements 260 that may be included in any pull-up driver 215 or pull-down driver 225. Each driver element 260 may comprise one or more transistors, one or more resistive components, or any combination thereof. The resistors shown in each pull-up driver 215, pull-down driver 225, and driver element 260 of FIG. 2 may be a symbolic representation of an impedance (e.g., output impedance) of the pull-up driver 215, pull-down driver 225, or driver element 260, and each pull-up driver 215, pull-down driver 225, or driver element 260 may comprise one or more additional or alternative components. Each driver element 260 may be operable to couple a first terminal (e.g., upper terminal as illustrated in FIG. 2) of the driver element 260 with a second terminal (e.g., lower terminal as illustrated in FIG. 2) of the driver element 260 when the driver element 260 is activated (e.g., when a pull-up driver 215 or pull-down driver 225 that includes the driver element 260 is activated) and to decouple the first terminal of the driver element 260 from the second terminal of the driver element 260 when the driver element 260 is deactivated (e.g., when a pull-up driver 215 or pull-down driver 225 that includes the driver element 260 is deactivated).

A pull-up driver 215 or pull-down driver 225 may include any quantity of driver elements 260, which may be coupled with each other in parallel. The more driver elements 260 included in a pull-up driver 215 or pull-down driver 225, the greater the strength (e.g. the lower the output impedance) the pull-up driver 215 or pull-down driver 225 may have when activated. The strength of each individual driver element 260 may be non-linear as a function of voltage (e.g., an output impedance of the driver element 260 may vary in non-linear fashion as a function of the voltage differential between the first and second terminals of the driver element 260). Because of the non-linear behavior of each constituent driver element 260, the strength of each pull-up driver 215 or pull-down driver 225 may likewise be non-linear as a function of voltage (e.g., an overall impedance of the pull-up driver 215 or pull-down driver 225 may vary in non-linear fashion as a function of the output voltage of the pull-up driver 215 or pull-down driver 225, which may be based on or otherwise correspond to the voltage differential between the first and second terminals of the constituent driver elements 260).

Further, in some cases, the quantity of driver elements 260 that are activated when a corresponding pull-up driver 215 or pull-down driver 225 is activated may be controlled by a code, which may be referred to as a strength code for the pull-up driver 215 or pull-down driver 225. That is, when a pull-up driver 215 or pull-down driver 225 is activated, a configurable quantity of the driver elements 260 within the pull-up driver 215 or pull-down driver 225 may be activated (e.g., in some cases, only a subset of the driver elements 260 within the pull-up driver 215 or pull-down driver 225 may be activated). For example, when a pull-up driver 215 or pull-down driver 225 is activated using a first strength code, a first quantity of driver elements 260 may be activated, and when the pull-up driver 215 or pull-down driver 225 is activated using a second strength code, a second quantity of driver elements 260 may be activated.

In the example illustrated in FIG. 2, the pull-down drivers 225 may be configured to be operated according to a binary coding scheme. For example, there are two pull-down drivers 225 in the example of FIG. 2, and the first pull-down driver 225-a may correspond to a most significant bit (MSB) of a binary code, while the second pull-down driver 225-b may correspond to a least significant bit of the binary code. The binary coding scheme may alternatively be referred to as an MSB/LSB coding scheme. The binary code may correspond to a logic value of the bits represented by a target voltage to which the driver 250 is to drive the signal line 210. For example, V0 may represent two bits corresponding to a logic value (and hence a binary code) of 00, V1 may represent two bits corresponding to a logic value (and hence a binary code) of 01, V2 may represent two bits corresponding to a logic value (and hence a binary code) of 10, and V3 may represent two bits corresponding to a logic value (and hence a binary code) of 11. The first pull-down driver 225-a may be activated or deactivated based on a logic value of the MSB (e.g., in active low fashion as shown in the example of FIG. 2, meaning activated when the MSB is 0 and deactivated when the MSB is 1). The second pull-down driver 225-b may be activated or deactivated based on a logic value of the LSB (e.g., in active low fashion as shown in the example of FIG. 2, meaning activated when the LSB is 0 and deactivated when the LSB is 1).

Additionally or alternatively, the first pull-up driver 215-a and the second pull-up driver 215-b may be configured to be operated according to a binary coding scheme. For example, the first pull-up driver 215-a may be activated or deactivated based on a logic value of the MSB (e.g., in active high fashion as shown in the example of FIG. 2, meaning activated when the MSB is 1 and deactivated when the MSB is 0). The second pull-up driver 215-b may be activated or deactivated based on a logic value of the LSB (e.g., in active high fashion as shown in the example of FIG. 2, meaning activated when the LSB is 1 and deactivated when the LSB is 0).

In some examples, each pull-down driver 225 and pull-up driver 215 may be calibrated to have a calibrated impedance at a respective one of the voltages 230. For example, a strength code for use in activating a pull-down driver 225 or pull-up driver 215 may be determined based on operating the pull-down driver 225 or pull-up driver 215 at a respective one of the voltages 230, where a quantity of activated driver elements included in a pull-down driver 225 or pull-up driver 215 may depend on (e.g., correspond to, be controlled by) the strength code used to activate the pull-down driver 225 or pull-up driver 215. Example details of calibration techniques are described further elsewhere herein.

Because the second pull-up driver 215-b is the only pull-up driver 215 activated to drive the signal line 210 to V1, the second pull-up driver 215-b may be calibrated at V1 (e.g., a strength code used to activate the second pull-up driver 215-b may be determined based on operating the second pull-up driver 215-b to have an output voltage equal to V1). Similarly, because the first pull-up driver 215-a is the only pull-up driver 215 activated to drive the signal line 210 to V2, the first pull-up driver 215-a may be calibrated at V2 (e.g., a strength code used to activate the first pull-up driver 215-a may be determined based on operating the first pull-up driver 215-a to have an output voltage equal to V2).

As shown in the example of FIG. 2, the first pull-up driver 215-a and the second pull-up driver 215-b both may also be used (e.g., activated), however, to drive the signal line 210 to V3. Due to one or more non-linearities associated with the pull-up drivers 215 (e.g., non-linearities of the driver elements 260 thereof), however, the first pull-up driver 215-a may have a different drive strength (e.g., different impedance) when activated at V3 than when activated at V2, and the second pull-up driver 215-b may have a different drive strength (e.g., different impedance) when activated at V3 than when activated at V1. That is, when activated at V3, the impedance of the first pull-up driver 215-a may be different than its calibrated impedance, and impedance of the second pull-up driver 215-b may be different than its calibrated impedance. Such impedance deviations may cause the signal line 210 to be driven to a non-ideal voltage (e.g., a voltage different than an ideal target voltage for V3), which may adversely impact the reliability with which a receiving device may decode signaling generated by the driver. For example, if the termination impedance 240 is 40 ohms, the first pull-up driver 215-a may be calibrated to have an impedance of 60 ohms when activated at V2, and the second pull-up driver 215-b may be calibrated to have an impedance of 120 ohms when activated at V1, but the first pull-up driver 215-a and the second pull-up driver 215-b may have different respective impedances when activated at V3.

To compensate for the deviations of the first pull-up driver 215-a and the second pull-up driver 215-b from their respective calibrated impedances when activated V3, the driver 250 may include one or more additional pull-up drivers 215. For example, the driver 250 may include a third pull-up driver 215-c, and in some cases, the driver 250 may further include a fourth pull-up driver 215-d. The one or more additional pull-up drivers 215 may be activated, in conjunction with the first pull-up driver 215-a and the second pull-up driver 215-b, to drive the signal line 210 to V3. For example, the e or more additional pull-up drivers 215 may be configured to be activated based on both the first pull-up driver 215-a and the second pull-up driver 215-b being activated (e.g., based on logic circuitry implementing an AND function based on the activation signals for the first pull-up driver 215-a and the second pull-up driver 215-b, based on a logic value to be signaled via the signal line 210 being 11, or any combination thereof).

When activated in conjunction with the first pull-up driver 215-a and the second pull-up driver 215-b, the one or more additional pull-up drivers 215 may provide additional drive strength (e.g., may lower the overall impedance of the driver 250 in the pull-up direction towards VDDQ), which may compensate for the deviations of the first pull-up driver 215-a and the second pull-up driver 215-b from their respective calibrated impedances. Thus, the driver 250 may include at least one additional pull-up drivers 215 configured to be activated in conjunction with one or more other pull-up driver 215 at a particular voltage 230, where the one or more other pull-up drivers 215 are each activated individually and calibrated at a respective other voltage 230, and where the at least one additional pull-up driver 215 compensates for impedance deviations of the one or more other pull-up drivers 215 at the particular voltage 230 relative to their respective calibrated impedances at the respective other voltage 230. This and other aspects of the teachings herein may cause the voltage margins 235 to be equal (or at least more equal) in size relative to one another, may avoid one or more of the voltage margins 235 becoming undesirably small, or any combination thereof, which may improve the reliability which signaling transmitted (e.g., generated) using the driver 250 may be interpreted (e.g., decoded, serialized) by a receiving device.

In some examples, the third pull-up driver 215-c may be calibrated to compensate for the deviations of both the first pull-up driver 215-a and the second pull-up driver 215-b at V3 from their respective calibrated impedances. The fourth pull-up driver 215-d may not be present. For instance, the third pull-up driver 215-c may be calibrated at V3 while operated in parallel with the first pull-up driver 215-a and the second pull-up driver 215-b (or in parallel with equivalently configured pull-up drivers 215).

In some examples, the third pull-up driver 215-c may be calibrated to compensate for the deviation of the first pull-up driver 215-a at V3 from its calibrated impedance at V2, and the fourth pull-up driver 215-d may be calibrated to compensate for the deviation of the second pull-up driver 215-b at V3 from its calibrated impedance at V1. For instance, the third pull-up driver 215-c may be calibrated at V3 while operated in parallel with the first pull-up driver 215-*a* (or in parallel with an equivalently configured pull-up driver 215), and the fourth pull-up driver 215-*d* may be calibrated at V3 while operated in parallel with the second pull-up driver 215-*b* (or in parallel with an equivalently configured pull-up driver 215).

And in some examples, the third pull-up driver 215-*c* and the fourth pull-up driver 215-*d* may be calibrated in parallel so as to jointly compensate for the deviations of the first pull-up driver 215-*a* and the second pull-up driver 215-*b* from their respective calibrated impedances. For instance, the third pull-up driver 215-*c* and the fourth pull-up driver 215-*d* may be calibrated at V3 (e.g., concurrently) while operated in parallel with the first pull-up driver 215-*a* and the second pull-up driver 215-*b* (or in parallel with equivalently configured pull-up drivers 215).

In the example of FIG. 2, the driver 250 includes one or more additional pull-up drivers 215 (e.g., relative to a quantity of pull-down drivers 225, relative to a quantity of bits of information to be indicated by each target voltage 230 of the modulation scheme, or both). For instance, the driver 250 may be considered as including a set of pull-down drivers 225 (e.g., a set of pull-down drivers 225 configured to respectively be activated based on a respective bit to be indicated, such as the MSB or LSB as described herein), a set of pull-up drivers 215 including a same quantity of pull-up drivers 215 as the quantity of pull-down drivers 225 in the set of pull-down drivers 225 (e.g., a set of pull-up drivers 215 also configured to respectively be activated based on a respective bit to be indicated), and one or more additional pull-up drivers 215. It is to be understood, however, that in other examples, a driver 250 as described herein may additionally or alternatively include one or more additional pull-down drivers 225.

Figure 3:
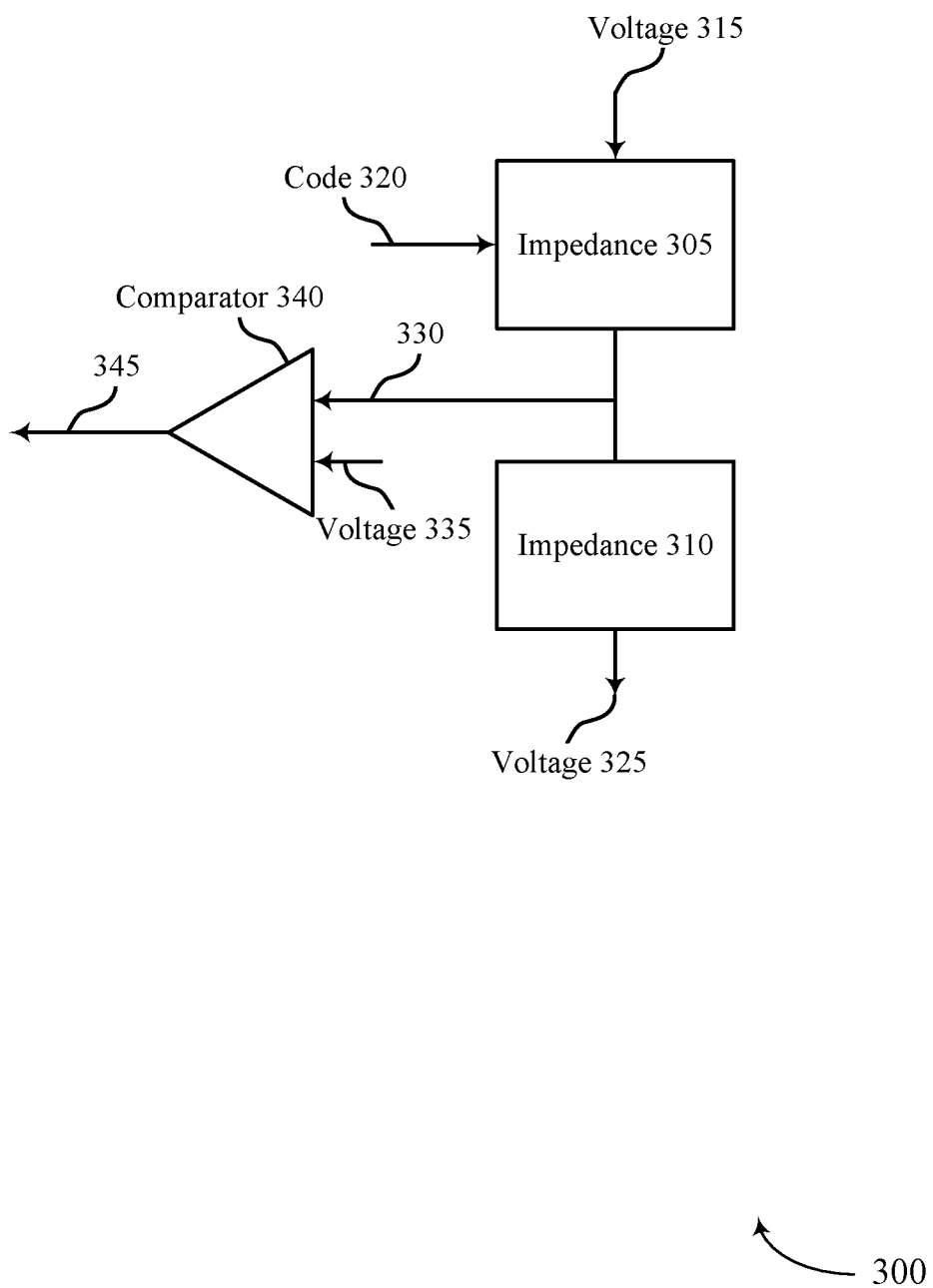
FIG. 3 illustrates an example of a circuit that supports an improved driver for non-binary signaling in accordance with examples as disclosed herein.

FIG. 3 illustrates an example of a circuit 300 that supports an improved driver for non-binary signaling in accordance with examples as disclosed herein. Circuit 300 may be used by a memory device (e.g., memory device 110) or a memory device controller (e.g., memory device controller 155) to calibrate a pull-up driver (e.g., pull-up driver 215 as described with reference to FIG. 2) or a pull-down driver (e.g., pull-down driver 225 as described with reference to FIG. 2). The circuit 300 may include a first impedance 305 and a second impedance 310. The circuit 300 may also include a comparator 340.

The first impedance 305 may be coupled with a voltage 315 and a second impedance 310 in series. The first impedance 305 may represent an impedance of a pull-up driver or pull-down driver. The second impedance 310 may represent a reference impedance. For example, the second impedance 310 may be an external (e.g. off-die) resistor with a known value—e.g., 120 ohms. In other cases, the second impedance 310 may be the impedance of a calibrated pull-down driver or pull-up driver.

The first impedance 305 and the second impedance 310 may be configured as a voltage divider and output a voltage 330 to a first input of a comparator 340. The voltage divider may divide the voltage differential between the voltage 315 and the voltage 325. For example, in some cases, the voltage 315 may be a higher voltage (e.g. VDDQ) than the voltage 325 (e.g., VSS), and the first impedance 305 may represent the impedance of a pull-up driver. In other cases, the voltage 315 may be a lower voltage (e.g. VSS) than the voltage 325 (e.g., VDDQ), and the first impedance 305 may represent the impedance of a pull-down driver.

The pull-up driver or pull-down driver represented by the first impedance 305 may be configured to receive a code 320. As described with reference to FIG. 2, a pull-up driver or pull-down driver may comprise one or more driver elements in parallel, each driver element comprising one or more transistors, resistive components, or other components in parallel. For example, a pull-up driver or pull-down driver may comprise a plurality of n-type or p-type channel metal-oxide semiconductor transistors (e.g., NMOS or PMOS transistors). The code 320 may be an example of a strength code. In such examples, the code 320 may be a binary code that activates a corresponding quantity of the driver elements. For example, the pull-up driver or pull-down driver represented by the first impedance 305 may include three (3) driver elements—e.g., three transistors in parallel. In such examples, the code 320 may activate one driver element, two driver elements, or all three driver elements, depending on the value of the code 320. By adjusting the code 320, the first impedance 305 may also be adjusted—e.g., the impedance of the first impedance 305 may increase or decrease based on the code 320, as fewer or more driver elements may be activated within the corresponding pull-up driver or pull-down driver. In other examples, the pull-up or pull-down drivers may include more than or less than three (3) driver elements and the code 320 may a code other than a binary code.

In some cases, comparator 340 may be configured to compare voltage 330 with a reference voltage 335. In some examples, the comparator 340 may be configured to output a signal 345 indicating the output voltage 330 matches (e.g., is the same as) the reference voltage 335. The reference voltage 335 may be set at the voltage at which the pull-up or pull-driver corresponding to the first impedance 305 is to be calibrated.

In some examples, circuit 300 may be used to calibrate a pull-up or pull-driver. For example, a second impedance 310 and reference voltage 335 may first be configured. The code 320 may be adjusted to calibrate the pull-up or pull-down driver. For example, adjusting the code 320 may adjust the first impedance 305 and hence the output voltage 330. In some examples, the circuit 300 may continue to adjust the code 320 (e.g., adjust a quantity of activated driver elements corresponding to the first impedance 305) until the comparator 340 outputs a signal 345 indicating the output voltage 330 is the same as the reference voltage 335. That is, the code 320 may be adjusted in order to adjust the quantity of activated driver elements of the pull-up or pull-down driver corresponding to the first impedance 305 until the output voltage 330 is the same as the reference voltage 335.

As an illustrative example, to calibrate a pull-up driver corresponding to the first impedance 305 to have a calibrated impedance of 120 ohms at a voltage equal to three-fourths (¾) the voltage difference between the voltage 315 and the voltage 325, where the voltage 325 is zero volts (e.g., ground), the circuit may include a second impedance 310 of 360 ohms and a reference voltage with a value three-fourths (¾) of the voltage 315. In such examples, the code 320 may be adjusted (and hence the activated impedance of the pull-up driver corresponding to the first impedance 305 may be adjusted) until the output voltage 330 matches the reference voltage 335—e.g., until the first impedance 305 is 120 ohms and the output voltage 330 is three-fourths of the voltage 315.

Figure 4:
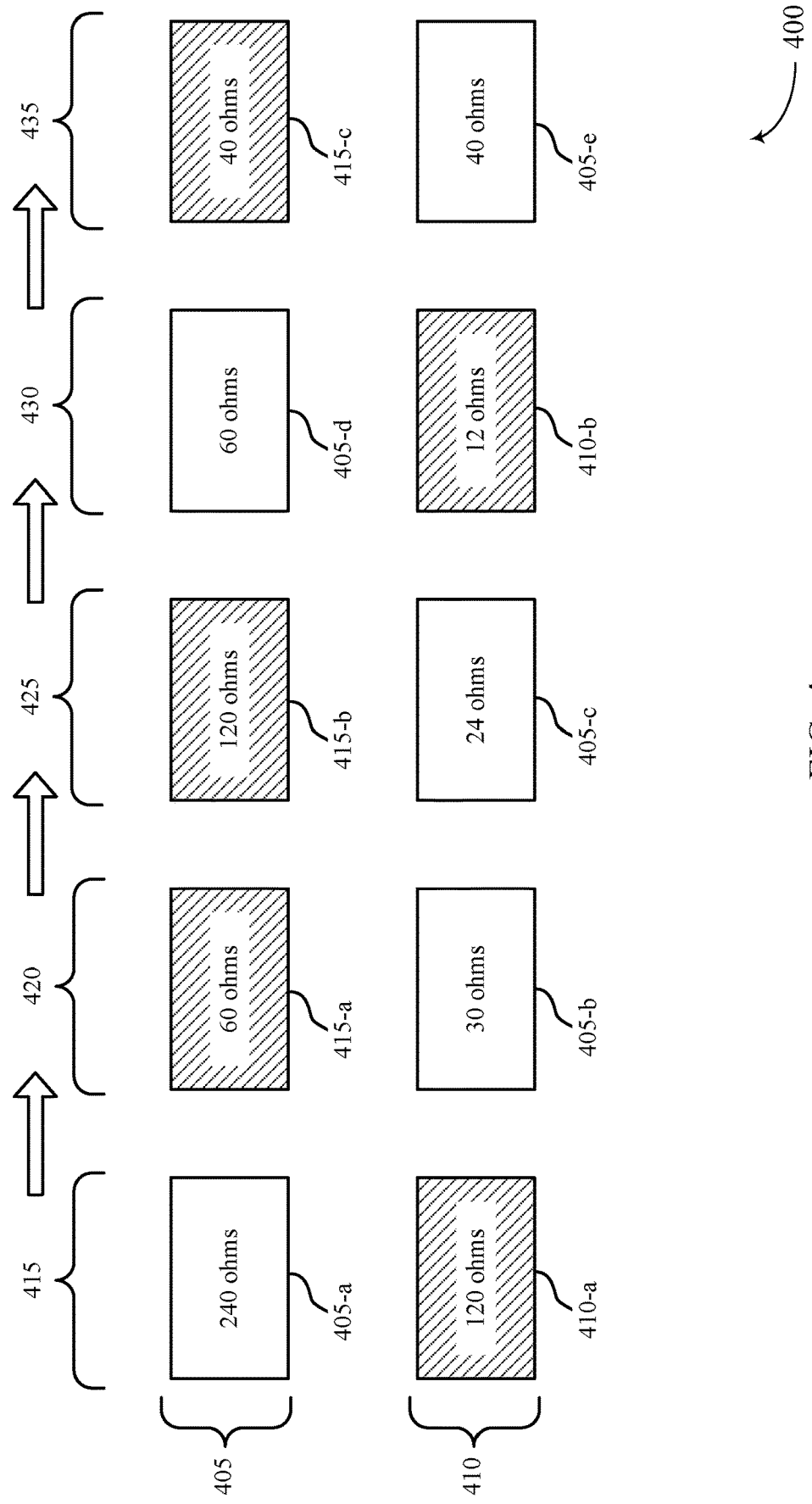
FIG. 4 illustrates an example of a calibration process that supports an improved driver for non-binary signaling in accordance with examples as disclosed herein.

FIG. 4 illustrates an example of a calibration process 400 that supports an improved driver for non-binary signaling in accordance with examples as disclosed herein. The operations of calibration process 400 may be implemented by a device or its components as described herein. For example, calibration process 400 may be performed by or on a system or circuit as described with reference to FIG. 1 or 2, and may be performed using a circuit or techniques as described with reference to FIG. 3. For example, calibration process 400 may illustrate a calibration process for a driver with a set of pull-up drivers 415 (e.g., set of pull-up drivers 215 as described with reference to FIG. 2) and a set of pull-down drivers 410 (e.g., set of pull-down drivers 225 as described with reference to FIG. 2), where the set of pull-up drivers 415 includes at least one pull-up driver 415 calibrated for use in conjunction with one or more other pull-up drivers 415. It should be noted the techniques described herein may additionally or alternatively be applied to a driver with a set of pull-up drivers 415 and set of pull-down drivers 410, where the set of pull-down drivers 410 includes at least one pull-down driver 410 calibrated for use in conjunction with one or more other pull-down drivers 410. Also, although shown in a particular sequence or order, unless otherwise specified, the order of the processes may be modified. Thus, the illustrated examples are used as examples, and the illustrated processes may be performed in a different order, and some processes may be performed in parallel.

At 415, a first pull-down driver 410-*a* (e.g., a second pull-down driver 225-*b* as described with reference to FIG. 2) may be calibrated at a first voltage (e.g., V2) using techniques as described with reference to FIG. 3. In some examples, the first pull-down driver 410-*a* may be coupled in series with a first reference impedance 405-*a* (e.g., a second impedance 310 as described with reference to FIG. 3). A voltage 315 as described with reference to FIG. 3 may be set to 0V, and a voltage 325 as described with reference to FIG. 3 may be set to VDDQ. In some examples, the first reference impedance 405-*a* may be an external (e.g., off-die) resistor with an impedance of 240 ohms. In other examples, the first reference impedance 405-*a* may be a different type of impedance, may have an impedance greater than or less than 240 ohms, or both.

In accordance with the process described with reference to FIG. 3, a strength code of the first pull-down driver 410-*a* may be adjusted until a voltage output (e.g., a voltage 330 as described with reference to FIG. 3) matches a reference voltage at a comparator (e.g., a reference voltage 335 at a comparator 340 as described with reference to FIG. 3). In some examples, the reference voltage may be V2 and thus one-third (⅓) of the voltage of VDDQ. Hence, the first pull-down driver 410-*a* may be calibrated at V2, and the first pull-down driver 410-*a* may be calibrated to have a first calibrated impedance of 120 ohms at V2, as this may create a one-third voltage divider with the first reference impedance 405-*a*. The strength code that results in the first pull-down driver 410-*a* having the first calibrated impedance may be referred to as a first strength code, and the first strength code may thereafter be used to activate the first pull-down driver 410-*a*, or to activate other like drivers (e.g., each second pull-down driver 225-*b* within a set of drivers 250 may be activated using the first strength code derived from calibrating the first pull-down driver 410-*a*).

At 420, a first pull-up driver 415-*a* (e.g., a first pull-up driver 215-*a* as described with reference to FIG. 2) may be calibrated at the first voltage (e.g., V2) using techniques as described with reference to FIG. 3. In some examples, the first pull-up driver 415-*a* may be coupled in series with a second reference impedance 405-*b* (e.g., another second impedance 310 as described with reference to FIG. 3). A voltage 315 as described with reference to FIG. 3 may be set to VDDQ, and a voltage 325 as described with reference to FIG. 3 may be set to 0V. In some examples, the second reference impedance 405-*b* may comprise a set of pull-down drivers 410 (e.g., a set of second pull-down drivers 225-*b*) coupled with each other in parallel, where each of the pull-down drivers 410 of the set may be activated using the first strength code. Hence, the second reference impedance 405-*b* may be based on the first pull-down driver 410-*a* having been calibrated. For example, the second reference impedance 405-*a* may comprise four pull-down drivers 410 identical to the first pull-down driver 410-*a* and activated in parallel using the first strength code, and thus the second reference impedance 405-*a* may have an impedance of 30 ohms at V2.

In accordance with the process described with reference to FIG. 3, a strength code of the first pull-up driver 415-*a* may be adjusted until a voltage output (e.g., a voltage 330 as described with reference to FIG. 3) matches a reference voltage at a comparator (e.g., a reference voltage 335 at a comparator 340 as described with reference to FIG. 3). In some examples, the reference voltage may be V2 and thus one-third (⅓) of the voltage of VDDQ. Hence, the first pull-up driver 415-*a* may be calibrated at V2, and the first pull-up driver 415-*a* may be calibrated to have a second calibrated impedance of 60 ohms at V2, as this may create a one-third voltage divider with the second reference impedance 405-*b*. The strength code that results in the first pull-up driver 415-*a* having the second calibrated impedance may be referred to as a second strength code, and the second strength code may thereafter be used to activate the first pull-up driver 415-*a*, or to activate other like drivers (e.g., each first pull-up driver 215-*a* within a set of drivers 250 may be activated using the second strength code derived from calibrating the first pull-up driver 415-*a*).

At 425, a second pull-up driver 415-*b* (e.g., a second pull-up driver 215-*b* as described with reference to FIG. 2) may be calibrated at a second voltage (e.g., V1) using techniques as described with reference to FIG. 3. In some examples, the second pull-up driver 415-*b* may be coupled in series with a third reference impedance 405-*c* (e.g., another second impedance 310 as described with reference to FIG. 3). A voltage 315 as described with reference to FIG. 3 may be set to VDDQ, and a voltage 325 as described with reference to FIG. 3 may be set to 0V. In some examples, the third reference impedance 405-*c* may comprise a set of pull-down drivers 410 (e.g., a set of second pull-down drivers 225-*b*) coupled with each other in parallel, where each of the pull-down drivers 410 of the set may be activated using the first strength code. Hence, the third reference impedance 405-*c* may be based on the first pull-down driver 410-*a* having been calibrated. For example, the third reference impedance 405-*c* may comprise five pull-down drivers 410 identical to the first pull-down driver 410-*a* and activated in parallel using the first strength code, and thus the third reference impedance 405-*c* may have an impedance of 24 ohms at V1, if it is assumed that the pull-down drivers 410 are substantially linear (e.g., more linear than the pull-up drivers 415), such as in the case of a VSS-terminated signal line (whereas in some cases, conversely, pull-up drivers 415 may be substantially linear—e.g., more linear than pull-down drivers 410—in the case of a VDDQ-terminated signal line.

In accordance with the process described with reference to FIG. 3, a strength code of the second pull-up driver 415-*b* may be adjusted until a voltage output (e.g., a voltage 330 as described with reference to FIG. 3) matches a reference voltage at a comparator (e.g., a reference voltage 335 at a comparator 340 as described with reference to FIG. 3). In some examples, the reference voltage may be V1 and thus one-sixth (⅙) of the voltage of VDDQ. Hence, the second pull-up driver 415-b may be calibrated at V1, and the second pull-up driver 415-b may be calibrated to have a third calibrated impedance of 120 ohms at V1, as this may create a one-sixth voltage divider with the third reference impedance 405-c. The strength code that results in the second pull-up driver 415-b having the third calibrated impedance may be referred to as a third strength code, and the third strength code may thereafter be used to activate the second pull-up driver 415-b, or to activate other like drivers (e.g., each second pull-up driver 215-b within a set of drivers 250 may be activated using the third strength code derived from calibrating the second pull-up driver 415-b).

At 430, a second pull-down driver 410-b (e.g., a first pull-down driver 225-a as described with reference to FIG. 2) may be calibrated at a second voltage (e.g., V1) using techniques as described with reference to FIG. 3. In some examples, the second pull-down driver 410-b may be coupled in series with a fourth reference impedance 405-d (e.g., another second impedance 310 as described with reference to FIG. 3). And in some examples, the second pull-down driver 410-b may further be coupled in parallel with one or more like pull-down drivers 410, such that the second pull-down driver 410-b may be calibrated while operated in parallel with the one or more like pull-down drivers 410.

A voltage 315 as described with reference to FIG. 3 may be set to 0V, and a voltage 325 as described with reference to FIG. 3 may be set to VDDQ. In some examples, the fourth reference impedance 405-d may comprise a set of pull-up drivers 415 (e.g., a set of second pull-up drivers 215-b) coupled with each other in parallel, where each of the pull-up drivers 415 of the set may be activated using the third strength code. Hence, the fourth reference impedance 405-d may be based on the second pull-up driver 415-b having been calibrated. For example, the fourth reference impedance 405-d may comprise two pull-up drivers 415 identical to the second pull-up driver 415-b and activated in parallel using the third strength code, and thus the fourth reference impedance 405-d may have an impedance of 60 ohms at V1.

In accordance with the process described with reference to FIG. 3, a strength code of the second pull-down driver 410-b (in some cases, along with the strength code of any like pull-down drivers 410 coupled in parallel with the second pull-down driver 410-b) may be adjusted until a voltage output (e.g., a voltage 330 as described with reference to FIG. 3) matches a reference voltage at a comparator (e.g., a reference voltage 335 at a comparator 340 as described with reference to FIG. 3). In some examples, the reference voltage may be V1 and thus one-sixth (⅙) of the voltage of VDDQ. Hence, the second pull-down driver 410-b may be calibrated at V1, the second pull-down driver 410-b may be coupled in parallel with four other like pull-down drivers 410 such that a total of five like pull-down drivers 410 are coupled in parallel, and hence the second pull-down driver 410-b may be calibrated to have a fourth calibrated impedance of 60 ohms at V1 (e.g., with the five like pull-down drivers 410 having a collective calibrated impedance of 12 ohms at V1), as this may create a one-sixth voltage divider with the fourth reference impedance 405-d. The strength code that results in the second pull-down driver 410-b having the fourth calibrated impedance may be referred to as a fourth strength code, and the fourth strength code may thereafter be used to activate the second pull-down driver 410-b, or to activate other like drivers (e.g., each first pull-down driver 225-a within a set of drivers 250 may be activated using the fourth strength code derived from calibrating the second pull-down driver 410-b).

At 435, a third pull-up driver 415-c (e.g., a third pull-up driver 215-c as described with reference to FIG. 2) may be calibrated at a third voltage (e.g., V3) using techniques as described with reference to FIG. 3. In some examples, the third pull-up driver 415-c may be coupled in series with a fifth reference impedance 405-e (e.g., another second impedance 310 as described with reference to FIG. 3). The third pull-up driver 415-c may further be coupled in parallel with the first pull-up driver 415-a and the second pull-up driver 415-b (or like drivers), such that the second pull-down driver 410-b may be calibrated while operated in parallel with the first pull-up driver 415-a and the second pull-up driver 415-b (or like drivers). Calibrating the third pull-up driver 415-c while operated at V3 in conjunction with (e.g., in parallel with) the first pull-up driver 415-a and the second pull-up driver 415-b may result in a calibrated impedance of the third pull-up driver 415-c that compensates for deviations of the first pull-up driver 415-a and the second pull-up driver 415-b at V3 from their respective calibrated impedances when the first pull-up driver 415-a, second pull-up driver 415-b, and third pull-up driver 415-c (or like drivers) are operated in conjunction with one another.

A voltage 315 as described with reference to FIG. 3 may be set to VDDQ, and a voltage 325 as described with reference to FIG. 3 may be set to 0V. In some examples, the fifth reference impedance 405-e may comprise a set of pull-down drivers 410. For example, the fifth reference impedance 405-e may include the first pull-down driver 410-a and second pull-down driver 410-b or like drivers (e.g., one first pull-down driver 225-a and one second pull-down driver 225-b) coupled with each other in parallel, where the first pull-down driver 410-a and second pull-down driver 410-b may be activated using the first strength code and the second strength code respectively. As another example, the fifth reference impedance 405-e may include the first pull-down driver 410-a and two like drivers (e.g., three second pull-down drivers 225-b) coupled with each other in parallel—or three like drivers coupled with each other in parallel—where each of the set of pull-down drivers 410 may be activated using the first strength code. Hence, the third reference impedance 405-c may be based on the first pull-down driver 410-a having been calibrated, the second pull-down driver 410-b having been calibrated, or both. For example, the third reference impedance 405-c may have an impedance of 40 ohms at V3 (e.g., one 120 ohm impedance and one 60 ohm impedance in parallel, or three 120 ohm impedances in parallel), if it is assumed that the pull-down drivers 410 are substantially linear (e.g., more linear than the pull-up drivers 415) such as in the case of a VSS-terminated signal line (whereas in some cases, conversely, pull-up drivers 415 may be substantially linear—e.g., more linear than pull-down drivers 410—in the case of a VDDQ-terminated signal line.

In accordance with the process described with reference to FIG. 3, a strength code of the third pull-up driver 415-c may be adjusted until a voltage output (e.g., a voltage 330 as described with reference to FIG. 3) matches a reference voltage at a comparator (e.g., a reference voltage 335 at a comparator 340 as described with reference to FIG. 3). Concurrently, the first pull-up driver 415-a and the second pull-up driver 415-b (or like drivers) may be activated using the first strength code and fourth strength code respectively. In some examples, the reference voltage may be V3 and thus one-half (½) of the voltage of VDDQ. Hence, the third pull-up driver 415-c may be calibrated at V3, and the third pull-up driver 415-*c* may be calibrated such that the first pull-up driver 415-*a*, second pull-up driver 415-*b*, and third pull-up driver 415-*c* in combination collectively have a fifth calibrated impedance of 40 ohms at V3, as this may create a one-half voltage divider with the fifth reference impedance 405-*e*. The strength code that results in the first pull-up driver 415-*a*, second pull-up driver 415-*b*, and third pull-up driver 415-*c* collectively having the fifth calibrated impedance may be referred to as a fifth strength code, and the fifth strength code may thereafter be used to activate the third pull-up driver 415-*c*, or to activate other like drivers (e.g., each third pull-up driver 215-*c* within a set of drivers 250 may be activated using the fifth strength code derived from calibrating the third pull-up driver 415-*c*).

In the example illustrated in FIG. 4, the third pull-up driver 415-*c* is calibrated at V3 while operated in parallel with the first pull-up driver 415-*a* and second pull-up driver 415-*b*, such that the third pull-up driver 415-*c* is calibrated to compensate for non-linearities of the first pull-up driver 415-*a* and second pull-up driver 415-*b* as exhibited at V3. In other examples, the third pull-up driver 415-*c* may be calibrated at V3 while operated in parallel with the first pull-up driver 415-*a*, such that the third pull-up driver 415-*c* is calibrated to compensate for non-linearities of the first pull-up driver 415-*a* as exhibited at V3, and a fourth pull-up driver 415 (e.g., a fourth pull-up driver 215-*d*) may be calibrated at V3 while operated in parallel with the second pull-up driver 415-*b*, such that the fourth pull-up driver 415 is calibrated to compensate for non-linearities of the second pull-up driver 415-*b* as exhibited at V3. And in other examples, the third pull-up driver 415-*c* may be calibrated at V3 while operated in parallel with the first pull-up driver 415-*a*, the second pull-up driver 415-*b*, and a fourth pull-up driver 415 (e.g., a fourth pull-up driver 215-*d*), such that the third pull-up driver 415-*c* and the fourth pull-up driver 415-*d* may be calibrated to collectively compensate for non-linearities of the first pull-up driver 415-*a* and second pull-up driver 415-*b* as exhibited at V3. Additionally or alternatively, in some examples, pull-down drivers 410 may be calibrated in like fashion as described for pull-up drivers 415 with reference to FIG. 4, including a third pull-down driver 410, a fourth pull-down driver 410, or both.

Figure 5:
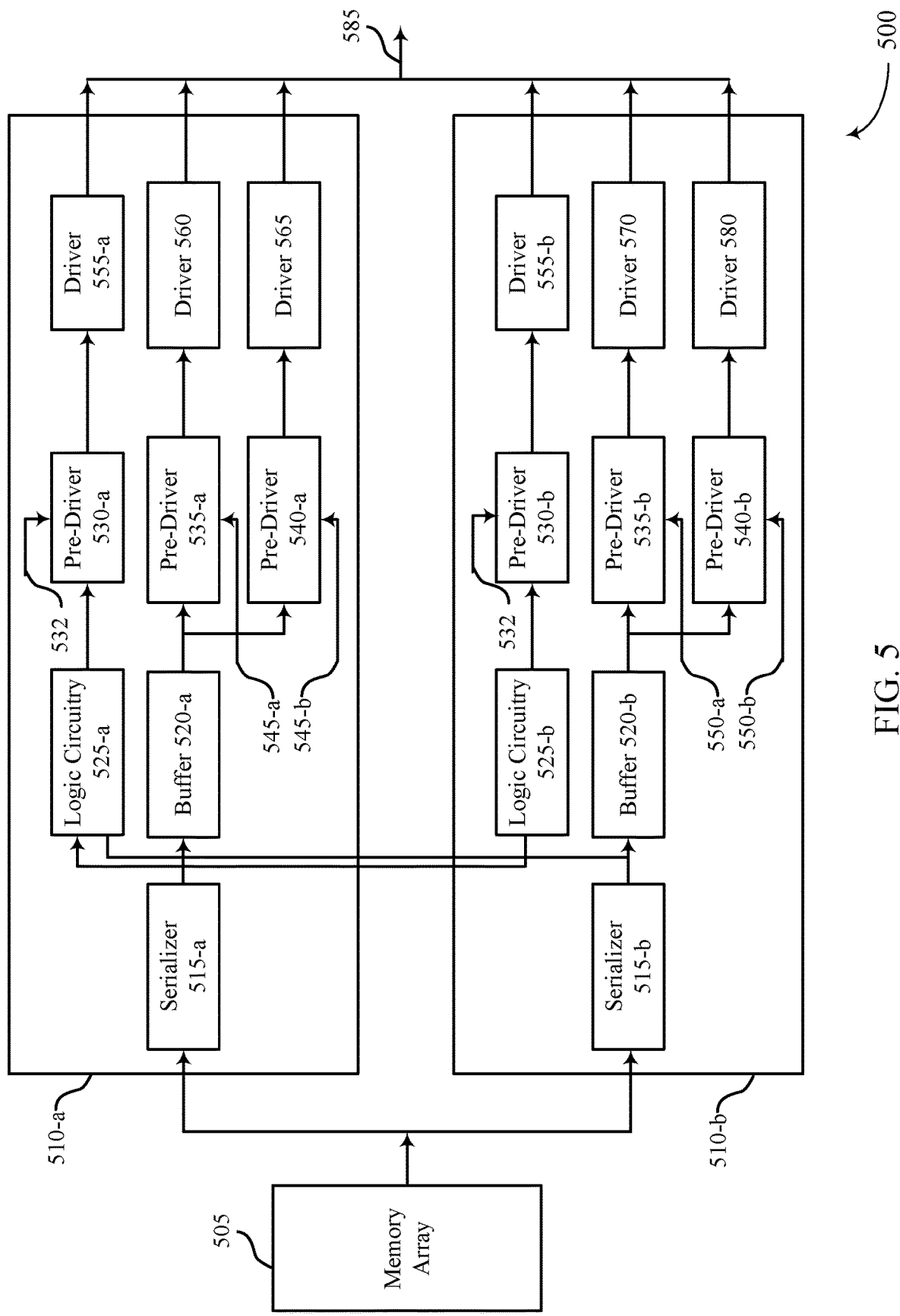
FIG. 5 illustrates an example of a circuit that supports an improved driver for non-binary signaling in accordance with examples as disclosed herein.

FIG. 5 illustrates an example of a circuit 500 that supports an improved driver for non-binary signaling in accordance with examples as disclosed herein. The circuit 500 may be an example of a driving circuit to transmit data from a memory array 505 to a data output signal line 585. The circuit 500 may include an MSB data path 510-*a* to communicate the MSB in a multi-level signal (e.g., a PAM4 symbol) and an LSB data path 510-*b* to communicate the LSB in the multi-level signal. Each data path 510 may include a serializer 515, a buffer 520, logic circuitry 525, pre-drivers 530, 535, and 540, drivers 555. The MSB data path 510-*a* may further include drivers 560 and 565 and the LSB data path 510-*b* may include drivers 570 and 580.

Memory array 505 (e.g., memory array 170 as described with reference to FIG. 1) may be configured to store data. In some examples, the memory array 505 may be configured to transmit a first data signal (e.g., first bit or stream of data) to the MSB data path 510-*a* and transmit a second data signal (e.g., a second bit or stream of data) to the LSB data path 510-*b*.

Serializer 515-*a* may be configured to receive the first data signal, serialize the first data signal, and output the serialized first data signal to the buffer 520-*a*. Serializer 515-*b* may be configured to receive the second data signal, serialize the second data signal, and output the serialized second data signal to the buffer 520-*b*. For example, each serializer 515 may receive a stream of data comprising a plurality of symbols. In some examples, a stream of data transmitted from the memory array 505 to the multiplexer 515 may be transmitted over a relatively wide data bus with a relatively low speed. Accordingly, the serializers 515 may serialize the data and ensure that one MSB data bit is outputted to buffer 520-*a* and a corresponding LSB data bit is outputted to the buffer 520-*b*.

Buffer 520-*a* and buffer 520-*b* may be configured to drive respective data signals received from the serializers 515 to a pre-driver 535 or pre-driver 540. For example, buffer 520-*a* may be configured to receive an MSB data bit and output the MSB data bit to the pre-drivers 535-*a* and 540-*a*. In other examples, buffer 520-*b* may be configured to receive an LSB data bit and output the LSB data bit to the pre-drivers 535-*b* and 540-*b*.

Pre-drivers 535 and pre-drivers 540 may be configured to condition or modify a data signal received from the respective buffers 520 based on a code 545. In some examples, the pre-drivers 535 and 540 may also be configured to select a respective driver 560 and 565 based on the data signal received from the buffers 520. For example, pre-driver 535-*a* and pre-driver 540-*a* may receive the MSB bit from the buffer 520-*a*. In some examples, pre-driver 535-*a* may mix the MSB bit with the code 545-*a* and the pre-driver 540-*a* may mix the MSB bit with the code 545-*b*. Based on the MSB bit, one of the pre-driver 535-*a* or pre-driver 540-*a* may activate their respective driver 560 or 565 to drive the data output signal line 585. For example, the pre-driver 535-*a* may receive a strength code 545-*a* associated with a calibration process of driver 560 and activate driver 560 based on a voltage associated with the data signal received. Pre-drivers 535-*b* and 540-*b* may be configured similarly and activate driver 570 or 580 based on a code 550 and data signal received from buffer 520-*b* e.g., based on the LSB data bit and the strength codes of the drivers 570 and 580 from a calibration process.

Drivers 560, 565, 570, and 580 may be configured to drive the data output signal line 585 to a voltage based on receiving a signal from a respective pre-driver 535 or pre-driver 540. In some examples, drivers 560 and 570 may be examples of drivers of a first type and drivers 565 and 580 may be examples of drivers of a second type. In other examples, drivers 565 and 580 may be examples of drivers of a first type and drivers 560 and 570 may be examples of drivers of a second type—e.g., based on which set of drivers includes the additional driver. For example, driver 560 may be an example of a first pull-up driver 215-*a*, driver 565 may be an example of a first pull-down driver 225-*a*, driver 570 may be an example of a second pull-up driver 215-*b*, and driver 580 may be an example of a second pull-down driver 225-*b*, as described with reference to FIG. 2.

Logic circuitry 525 may be configured to transmit a signal to a pre-driver 530 to activate a driver 555 (e.g., logic circuitry 525 may include logic circuitry 525-*a* configured to transmit a signal to a pre-driver 530-*a*, along with logic circuitry 525-*b* configured to transmit a signal to a pre-driver 530-*b*, where the pre-driver 530 includes the pre-driver 530-*a* and the pre-driver 530-*b*). In some examples, driver 555-*a* may be an example of a third pull-up driver 215-*c*, and driver 555-*b* may be an example of a fourth pull-up driver 215-*d* as described with reference to FIG. 2—e.g., additional pull-up drivers. In other examples, drivers 555 may be examples of additional pull-down drivers as described with reference to FIG. 2. In some examples, driver 555-*b* may be omitted and the driver 555 may be coupled in parallel to the driver 560 and driver 570. In some cases, the logic circuitry 525 may activate the pre-drivers 530 if the MSB and LSB signals are both high—e.g., the circuit 500 drives the data output signal line 585 to a voltage 230-d as described with reference to FIG. 2.

Pre-driver 530-a may be configured to activate driver 555-a based on receiving a signal from the logic circuitry 532. In some examples, the pre-driver 530 may be configured to modify an impedance of driver 555 based on receiving a code 532. In some examples, code 532 may be an example of a strength code determined during a calibration process of driver 555. That is, drivers 555-a and 555-b may compensate for non-linear impedances of drivers 560 and 570 when the data output signal line 585 is driven high as described elsewhere herein.

In some examples, the memory array 505 may transmit a low MSB signal and a low LSB signal. In such examples, logic circuitry 525 may be deactivated and pre-driver 540-a may activate driver 565 and pre-driver 540-b may activate driver 580 to drive the data output signal line 585 to a first voltage (e.g., voltage 230-a as described with reference to FIG. 2). In such examples, pre-driver 535-a and pre-driver 535-b may deactivate driver 560 and driver 570, respectively.

In other examples, the memory array 505 may transmit a low MSB and a high LSB signal. In such examples, logic circuitry 525 may be deactivated and pre-driver 540-a may activate driver 565 and pre-driver 535-b may activate driver 570 to drive the data output signal line 585 to a second voltage (e.g., voltage 230-b as described with reference to FIG. 2). In such examples, pre-driver 535-a and pre-driver 540-b may deactivate driver 560 and driver 580, respectively.

In other instances, the memory array 505 may transmit a high MSB and a low LSB signal. In such examples, logic circuitry 525 may be deactivated and pre-driver 535-a may activate driver 560 and pre-driver 540-b may activate driver 580 to drive the data output signal line 585 to a third voltage (e.g., voltage 230-c as described with reference to FIG. 2). In such examples, pre-driver 540-a and pre-driver 535-b may deactivate driver 565 and driver 570, respectively.

In other cases, the memory array 505 may transmit a high MSB and a high LSB signal. In such examples, logic circuitry 525 may be activated and pre-driver 530-a may activate driver 555-a and pre-driver 530-b may activate driver 555-b. Additionally, pre-driver 535-a may activate driver 560 and pre-driver 535-b may activate driver 570 to drive the data output signal line 585 to a fourth voltage (e.g., voltage 230-d as described with reference to FIG. 2). That is, the drivers 555-a, 555-b, 560, and 570 may all be active to drive the data output signal line 585 to the fourth voltage. In examples where the driver 555-b is omitted, pre-driver 530-a may activate the driver 555-a drivers 555-a, 560, and 570 and may be activated to drive the data output signal line 585 to the fourth voltage. In examples where the data output signal line 585 is driven to the fourth voltage, pre-driver 540-a and pre-driver 540-b may deactivate driver 565 and driver 580, respectively. By activating the driver 555-a (and 555-b in some examples), the circuit 500 may increase the accuracy of signaling the fourth voltage and reduce impedance deviations as a result of calibrating the driver 560 at the third voltage and driver 570 at the second voltage.

In some examples, the driver may include a third pull-down driver, potentially along with a fourth pull-down driver, which if present may be activated concurrently with drivers 565 and 580 to drive the signal line 585 to the first voltage. For example, the third pull-down driver (and the fourth pull-down driver, if present) may be activated based on inverted versions of the signals output by the logic circuitry 525-a and 525-b and hence may be activated when the MSB and LSB signals are both low. The third pull-down driver (and the fourth pull-down driver, if present) may provide benefits similar to those described for the drivers 555, but in the pull-down direction rather than the pull-up direction.

Figure 6:
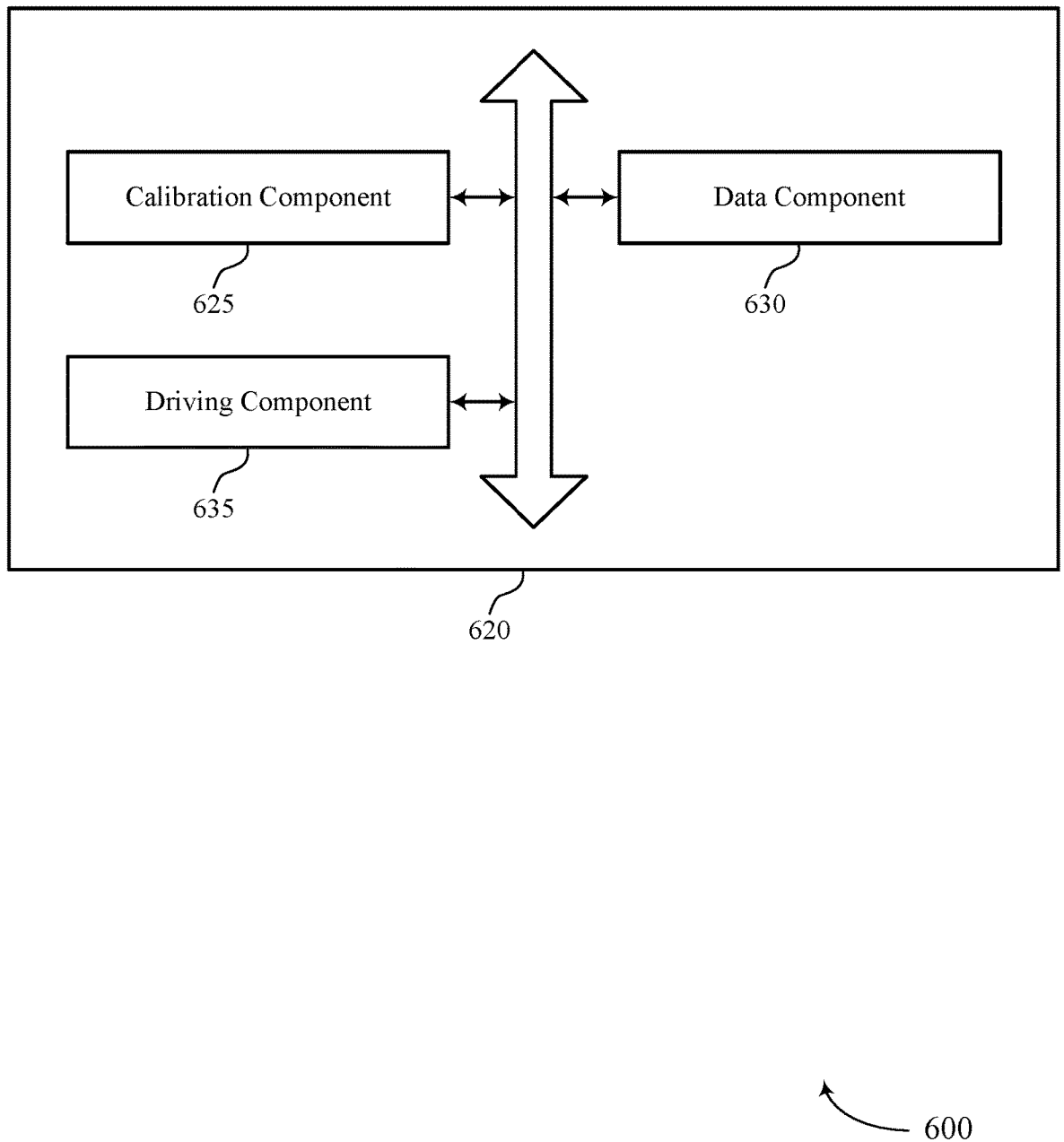
FIG. 6 shows a block diagram of a memory device that supports an improved driver for non-binary signaling in accordance with examples as disclosed herein.

FIG. 6 shows a block diagram 600 of a memory device 620 that supports improved driver for non-binary signaling in accordance with examples as disclosed herein. The memory device 620 may be an example of aspects of a memory device as described with reference to FIGS. 1 through 5. The memory device 620, or various components thereof, may be an example of means for performing various aspects of improved driver for non-binary signaling as described herein. For example, the memory device 620 may include a calibration component 625, a data component 630, a driving component 635, or any combination thereof. Each of these components may communicate, directly or indirectly, with one another (e.g., via one or more buses).

The calibration component 625 may be configured as or otherwise support a means for calibrating a first driver of a first type at a first voltage, where the first driver of the first type is configured to drive a signal line to the first voltage. In some examples, the calibration component 625 may be configured as or otherwise support a means for calibrating a second driver of the first type at a second voltage, where the second driver of the first type is configured to drive the signal line to the second voltage. In some cases, the calibration component 625 may be configured as or otherwise support a means for calibrating a third driver of the first type at a third voltage, where the third driver of the first type is configured to drive the signal line to the third voltage while the first driver of the first type and the second driver of the first type are activated. As used herein, a driver of a first type may refer to a pull-up driver while a driver of a second type refers to a pull-down driver, or a driver of a first type may refer to a pull-down driver while a driver of a second type refers to a pull-up driver).

In some examples, the first driver of the first type may be configured to drive the signal line to the first voltage while the second driver of the first type and the third driver of the first type are deactivated, and the second driver of the first type may be configured to drive the signal line to the second voltage while the first driver of the first type and the third driver of the first type are deactivated.

In some instances, to support calibrating the third driver of the first type, the calibration component 625 may be configured as or otherwise support a means for coupling the third driver of the first type in parallel with the first driver of the first type and the second driver of the first type after calibrating the first driver of the first type and the second driver of the first type. In some examples, to support calibrating the third driver of the first type, the calibration component 625 may be configured as or otherwise support a means for adjusting, while the third driver of the first type is coupled in parallel with the first driver of the first type and the second driver of the first type, and while the first driver of the first type and the second driver of the first type are activated, a strength code for the third driver of the first type until an output voltage of the third driver of the first type matches the third voltage.

In some cases, the calibration component 625 may be configured as or otherwise support a means for calibrating a first driver of a second type at the second voltage while coupled with a first resistance. In some instances, to support calibrating the first driver of the first type, the calibration component 625 may be configured as or otherwise support a means for coupling the first driver of the first type with a second resistance, the second resistance based at least in part on the first driver of the second type being calibrated. And in some instances, to support calibrating the second driver of the first type, the calibration component 625 may be configured as or otherwise support a means for coupling the second driver of the first type with a third resistance, the third resistance based at least in part on the first driver of the second type being calibrated. And in some instances, to support calibrating the third driver of the first type, the calibration component 625 may be configured as or otherwise support a means for coupling the third driver of the first type with a fourth resistance, the fourth resistance based at least in part on the first driver of the second type being calibrated.

In some examples, the calibration component 625 may be configured as or otherwise support a means for calibrating a second driver of the second type at the first voltage while coupled with a fifth resistance, the fifth resistance based at least in part on the second driver of the first type being calibrated.

In some cases, to support calibrating the first driver of the second type, the calibration component 625 may be configured as or otherwise support a means for coupling the first driver of the second type in series with a resistor having the first resistance. In some instances, to support calibrating the first driver of the second type, the calibration component 625 may be configured as or otherwise support a means for adjusting, while the first driver of the second type is coupled with the resistor, a strength code for the first driver of the second type until a fourth voltage output by the first driver of the second type matches the first voltage.

In some cases, to support calibrating the first driver of the first type, the calibration component 625 may be configured as or otherwise support a means for coupling the first driver of the first type in series with a plurality of drivers of the second type, the plurality of drivers of the second type configured to collectively generate the second resistance based at least in part on being coupled in parallel (e.g., with each other of the plurality of drivers of the second type), and the plurality of drivers of the second type each configured based at least in part on calibrating the first driver of the second type.

In some examples, to support calibrating the second driver of the first type, the calibration component 625 may be configured as or otherwise support a means for coupling the second driver of the first type in series with a plurality of drivers of the second type, the plurality of drivers of the second type configured to collectively generate the third resistance based at least in part on being coupled in parallel (e.g., with each other of the plurality of drivers of the second type), and the plurality of drivers of the second type each configured based at least in part on calibrating the first driver of the second type.

In some instances, to support calibrating the third driver of the first type, the calibration component 625 may be configured as or otherwise support a means for coupling the third driver of the first type in parallel with the first driver of the first type and the second driver of the first type. In some examples, to support calibrating the third driver of the first type, the calibration component 625 may be configured as or otherwise support a means for coupling the third driver of the first type in series with a plurality of drivers of the second type, the plurality of drivers of the second type configured to collectively generate the fourth resistance based at least in part on being coupled in parallel (e.g., with each other of the plurality of drivers of the second type), the plurality of drivers of the second type each configured based at least in part on calibrating the first driver of the second type and a second driver of the second type.

In some examples, the calibration component 625 may be configured as or otherwise support a means for calibrating a fourth driver of the first type at the third voltage, where the fourth driver of the first type is configured to drive the signal line to the third voltage while the first driver of the first type, the second driver of the first type, and the third driver of the first type are activated. In some cases, calibrating the fourth driver of the first type may occur concurrently with calibrating the third driver of the first type, and to support calibrating the third driver of the first type, the calibration component 625 may be configured as or otherwise support a means for coupling the fourth driver of the first type in parallel with the first driver of the first type, the second driver of the first type, and the third driver of the first type.

The data component 630 may be configured as or otherwise support a means for identifying, based at least in part on first data stored within a memory array, a first logic state to indicate via a signal line using a driver. The driver may include a set of drivers of a first type, a set of drivers of the second type including a same quantity of drivers as the set of drivers of the first type, and an additional driver of the first type. The driving component 635 may be configured as or otherwise support a means for driving the signal line to a first voltage based at least in part on the data component 630 identifying the first logic state, where the first voltage is representative of the first logic state, and where driving the signal line to the first voltage includes activating a first driver of the first type within the set of drivers of the first type concurrent with a second driver of the second type within the set of drivers of the second type.

In some instances, the data component 630 may be configured as or otherwise support a means for identifying, based at least in part on second data stored within the memory array, a second logic state to indicate via the signal line using the driver. In some examples, the driving component 635 may be configured as or otherwise support a means for driving the signal line to a second voltage based at least in part on the data component 630 identifying the second logic state, where the second voltage is representative of the second logic state, and where driving the signal line to the second voltage includes activating a second driver of the first type within the set of drivers of the first type concurrent with a first driver of the second type within the set of drivers of the second type.

In some cases, the data component 630 may be configured as or otherwise support a means for identifying, based at least in part on third data stored within the memory array, a third logic state to indicate via the signal line using the driver. In some instances, the driving component 635 may be configured as or otherwise support a means for driving the signal line to a third voltage based at least in part on the data component 630 identifying the third logic state, where the third voltage is representative of the third logic state, and where driving the signal line to the third voltage includes activating the first driver of the first type and the second driver of the first type concurrent with the additional driver of the first type.

In some cases, to drive the signal line to the first voltage, the driving component 635 may be further configured to deactivate the second driver of the first type and the first driver of the second type concurrent with activating the first driver of the first type and the second driver of the second type. In some examples, to drive the signal line to the second voltage, the driving component 635 may be further configured to deactivate the first driver of the first type and the second driver of the second type concurrent with activating the second driver of the first type and the first driver of the second type. In some examples, to drive the signal line to the third voltage, the driving component 635 may be further configured to deactivate the first driver of the second type and the second driver of the second type concurrent with activating the first driver of the first type, the second driver of the first type, and the additional driver of the first type.

In some instances, the data component 630 may be configured as or otherwise support a means for identifying, based at least in part on fourth data stored within the memory array, a fourth logic state to indicate via the signal line using the driver. In some examples, the driving component 635 may be configured as or otherwise support a means for driving the signal line to a fourth voltage based at least in part on the data component 630 identifying the fourth logic state, where the fourth voltage is representative of the fourth logic state, and where driving the signal line to the fourth voltage includes activating the first driver of the second type and the second driver of the second type concurrent with deactivating the first driver of the first type, the second driver of the first type, and the additional driver of the first type.

Figure 7:
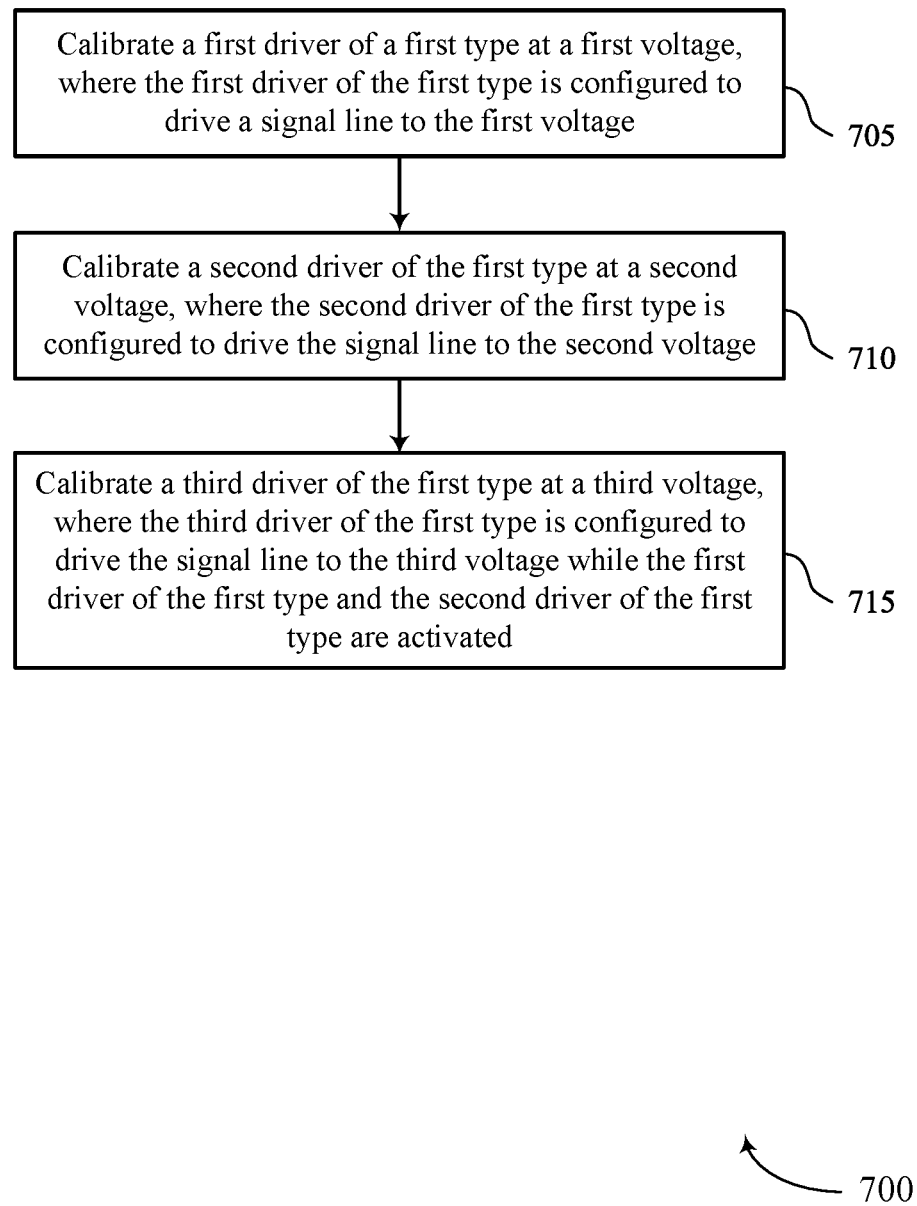
FIGS. 7 and 8 show flowcharts illustrating a method or methods that support an improved driver for non-binary signaling in accordance with examples as disclosed herein.

FIG. 7 shows a flowchart illustrating a method 700 that supports improved driver for non-binary signaling in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally or alternatively, the memory device may perform aspects of the described functions using special-purpose hardware.

At 705, the method may include calibrating a first driver of a first type at a first voltage, where the first driver of the first type is configured to drive a signal line to the first voltage. The operations of 705 may be performed in accordance with examples as disclosed herein. In some examples, aspects of the operations of 705 may be performed by a calibration component 625 as described with reference to FIG. 6.

At 710, the method may include calibrating a second driver of the first type at a second voltage, where the second driver of the first type is configured to drive the signal line to the second voltage. The operations of 710 may be performed in accordance with examples as disclosed herein. In some examples, aspects of the operations of 710 may be performed by a calibration component 625 as described with reference to FIG. 6.

At 715, the method may include calibrating a third driver of the first type at a third voltage, where the third driver of the first type is configured to drive the signal line to the third voltage while the first driver of the first type and the second driver of the first type are activated. The operations of 715 may be performed in accordance with examples as disclosed herein. In some examples, aspects of the operations of 715 may be performed by a calibration component 625 as described with reference to FIG. 6.

In some examples, an apparatus as described herein may perform a method or methods, such as the method 700. The apparatus may include, features, circuitry, logic, means, or instructions (e.g., a non-transitory computer-readable medium storing instructions executable by a processor) for calibrating a first driver of the first type at a first voltage, where the first driver of the first type is configured to drive a signal line to the first voltage, calibrating a second driver of the first type at a second voltage, where the second driver of the first type is configured to drive the signal line to the second voltage, and calibrating a third driver of the first type at a third voltage, where the third driver of the first type is configured to drive the signal line to the third voltage while the first driver of the first type and the second driver of the first type are activated.

In some instances of the method 700 and the apparatus described herein, the first driver of the first type may be configured to drive the signal line to the first voltage while the second driver of the first type and the third driver of the first type are deactivated, and the second driver of the first type may be configured to drive the signal line to the second voltage while the first driver of the first type and the third driver of the first type are deactivated.

In some cases of the method 700 and the apparatus described herein, operations, features, circuitry, logic, means, or instructions for calibrating the third driver of the first type may include operations, features, circuitry, logic, means, or instructions for coupling the third driver of the first type in parallel with the first driver of the first type and the second driver of the first type after calibrating the driver of the first type and the second driver of the first type and adjusting, while the third driver of the first type is coupled in parallel with the first driver of the first type and the second driver of the first type, and while the first driver of the first type and the second driver of the first type are activated, a strength code for the third driver of the first type until an output voltage of the third driver of the first type matches the third voltage.

Some instances of the method 700 and the apparatus described herein may further include operations, features, circuitry, logic, means, or instructions for calibrating a first driver of a second type at the second voltage while coupled with a first resistance, where calibrating the first driver of the first type includes coupling the first pull-driver with a second resistance, the second resistance based at least in part on the first driver of the second type being calibrated, calibrating the second driver of the first type includes coupling the second pull-driver with a third resistance, the third resistance based at least in part on the first driver of the second type being calibrated, and calibrating the third driver of the first type includes coupling the third pull-driver with a fourth resistance, the fourth resistance based at least in part on the first driver of the second type being calibrated.

Some cases of the method 700 and the apparatus described herein may further include operations, features, circuitry, logic, means, or instructions for calibrating a second driver of the second type at the first voltage while coupled with a fifth resistance, the fifth resistance based at least in part on the second driver of the first type being calibrated.

In some instances of the method 700 and the apparatus described herein, operations, features, circuitry, logic, means, or instructions for calibrating the first driver of the second type may include operations, features, circuitry, logic, means, or instructions for coupling the first driver of the second type in series with a resistor having the first resistance and adjusting, while the first driver of the second type is coupled with the resistor, a strength code for the first driver of the second type until a fourth voltage output by the first driver of the second type matches the first voltage.

In some cases of the method 700 and the apparatus described herein, operations, features, circuitry, logic, means, or instructions for calibrating the first driver of the first type may include operations, features, circuitry, logic, means, or instructions for coupling the first driver of the first type in series with a plurality of drivers of the second type, the plurality of drivers of the second type configured to collectively generate the second resistance based at least in part on being coupled in parallel, and the plurality of drivers of the second type each configured based at least in part on calibrating the first driver of the second type.

In some examples of the method 700 and the apparatus described herein, operations, features, circuitry, logic, means, or instructions for calibrating the second driver of the first type may include operations, features, circuitry, logic, means, or instructions for coupling the second driver of the first type in series with a plurality of drivers of the second type, the plurality of drivers of the second type configured to collectively generate the third resistance based at least in part on being coupled in parallel, and the plurality of drivers of the second type each configured based at least in part on calibrating the first driver of the second type.

In some examples of the method 700 and the apparatus described herein, operations, features, circuitry, logic, means, or instructions for calibrating the third driver of the first type may include operations, features, circuitry, logic, means, or instructions for coupling the third driver of the first type in parallel with the first driver of the first type and the second driver of the first type, and for coupling the third driver of the first type in series with a plurality of drivers of the second type, the plurality of drivers of the second type configured to collectively generate the fourth resistance based at least in part on being coupled in parallel, and the plurality of drivers of the second type each configured based at least in part on calibrating the first driver of the second type and a second driver of the second type.

Some instances of the method 700 and the apparatus described herein may further include operations, features, circuitry, logic, means, or instructions for calibrating a fourth driver of the first type at the third voltage, where the fourth driver of the first type may be configured to drive the signal line to the third voltage while the first driver of the first type, the second driver of the first type, and the third driver of the first type are activated, and where calibrating the fourth driver of the first type occurs concurrently with calibrating the third driver of the first type and includes coupling the fourth driver of the first type in parallel with the first driver of the first type, the second driver of the first type, and the third driver of the first type.

Figure 8:
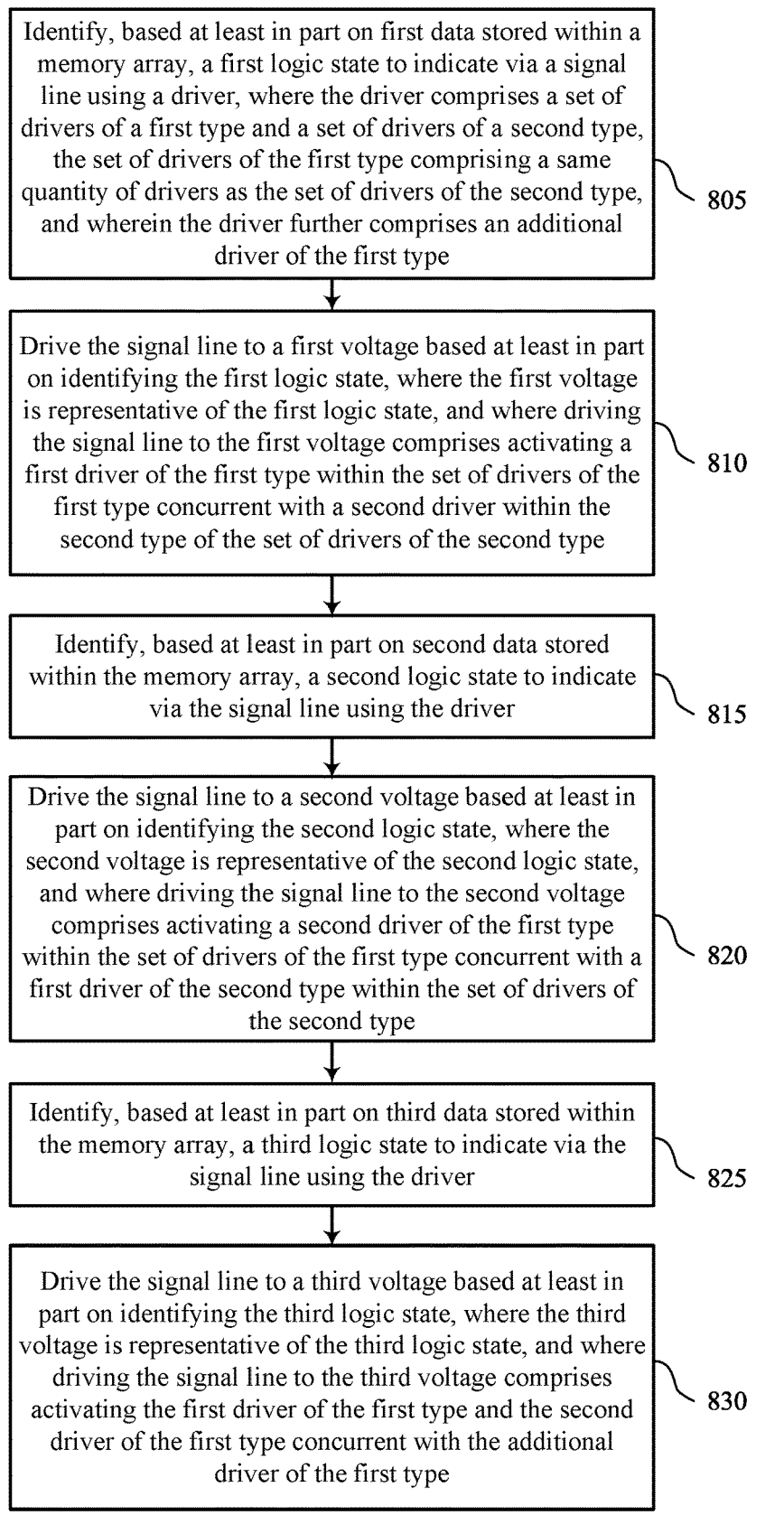

FIG. 8 shows a flowchart illustrating a method 800 that supports improved driver for non-binary signaling in accordance with examples as disclosed herein. The operations of method 800 may be implemented by a memory device or its components as described herein. For example, the operations of method 800 may be performed by a memory device as described with reference to FIGS. 1 through 6. In some examples, a memory device may execute a set of instructions to control the functional elements of the device to perform the described functions. Additionally or alternatively, the memory device may perform aspects of the described functions using special-purpose hardware.

At 805, the method may include identifying, based at least in part on first data stored within a memory array, a first logic state to indicate via a signal line using a driver, where the driver includes a set of drivers of a first type and a set of drivers of a second type, the set of drivers of the first type including a same quantity of drivers as the set of drivers of the second type, and where the driver includes an additional driver of the first type. The operations of 805 may be performed in accordance with examples as disclosed herein. In some examples, aspects of the operations of 805 may be performed by a data component 630 as described with reference to FIG. 6.

At 810, the method may include driving the signal line to a first voltage based at least in part on identifying the first logic state, where the first voltage is representative of the first logic state, and where driving the signal line to the first voltage includes activating a first driver of the first type within the set of drivers of the first type concurrent with a second driver of the second type within the set of drivers of the second type. The operations of 810 may be performed in accordance with examples as disclosed herein. In some examples, aspects of the operations of 810 may be performed by a driving component 635 as described with reference to FIG. 6.

At 815, the method may include identifying, based at least in part on second data stored within the memory array, a second logic state to indicate via the signal line using the driver. The operations of 815 may be performed in accordance with examples as disclosed herein. In some examples, aspects of the operations of 815 may be performed by a data component 630 as described with reference to FIG. 6.

At 820, the method may include driving the signal line to a second voltage based at least in part on identifying the second logic state, where the second voltage is representative of the second logic state, and where driving the signal line to the second voltage includes activating a second driver of the first type within the set of drivers of the first type concurrent with a first driver of the second type within the set of drivers of the second type. The operations of 820 may be performed in accordance with examples as disclosed herein. In some examples, aspects of the operations of 820 may be performed by a driving component 635 as described with reference to FIG. 6.

At 825, the method may include identifying, based at least in part on third data stored within the memory array, a third logic state to indicate via the signal line using the driver. The operations of 825 may be performed in accordance with examples as disclosed herein. In some examples, aspects of the operations of 825 may be performed by a data component 630 as described with reference to FIG. 6.

At 830, the method may include driving the signal line to a third voltage based at least in part on identifying the third logic state, where the third voltage is representative of the third logic state, and where driving the signal line to the third voltage includes activating the first driver of the first type and the second driver of the first type concurrent with the additional driver of the first type. The operations of 830 may be performed in accordance with examples as disclosed herein. In some examples, aspects of the operations of 830 may be performed by a driving component 635 as described with reference to FIG. 6.

In some cases, an apparatus as described herein may perform a method or methods, such as the method 800. The apparatus may include, features, circuitry, logic, means, or instructions (e.g., a non-transitory computer-readable medium storing instructions executable by a processor) for identifying, based at least in part on first data stored within a memory array, a first logic state to indicate via a signal line using a driver, where the driver includes a set of drivers of a first type and a set of drivers of the second type, the set of drivers of the first type including a same quantity of drivers as the set of drivers of the second type, and where the driver includes an additional driver of the first type. The apparatus may further include, features, circuitry, logic, means, or instructions for driving the signal line to a first voltage based at least in part on identifying the first logic state, where the first voltage is representative of the first logic state, and where driving the signal line to the first voltage includes activating a first driver of the first type within the set of drivers of the first type concurrent with a second driver of the second type within the set of drivers of the second type. The apparatus may further include, features, circuitry, logic, or means, or instructions for identifying, based at least in part on second data stored within the memory array, a second logic state to indicate via the signal line using the driver. The apparatus may further include, features, circuitry, logic, means, or instructions for driving the signal line to a second voltage based at least in part on identifying the second logic state, where the second voltage is representative of the second logic state, and where driving the signal line to the second voltage includes activating a second driver of the first type within the set of drivers of the first type concurrent with a first driver of the second type within the set of drivers of the second type. The apparatus may further include, features, circuitry, logic, or means, or instructions for identifying, based at least in part on third data stored within the memory array, a third logic state to indicate via the signal line using the driver. The apparatus may further include, features, circuitry, logic, means, or instructions for driving the signal line to a third voltage based at least in part on identifying the third logic state, where the third voltage is representative of the third logic state, and where driving the signal line to the third voltage includes activating the first driver of the first type and the second driver of the first type concurrent with the additional driver of the first type.

In some examples of the method 800 and the apparatus described herein, operations, features, circuitry, logic, means, or instructions for driving the signal line to the first voltage further include operations, features, circuitry, logic, means, or instructions for deactivating the second driver of the first type and the first driver of the second type concurrent with activating the first driver of the first type and the second driver of the second type, operations, features, circuitry, logic, means, or instructions for driving the signal line to the second voltage include operations, features, circuitry, logic, means, or instructions for deactivating the first driver of the first type and the second driver of the second type concurrent with activating the second driver of the first type and the first driver of the second type, and operations, features, circuitry, logic, means, or instructions for driving the signal line to the third voltage include operations, features, circuitry, logic, means, or instructions for deactivating the first driver of the second type and the second driver of the second type concurrent with activating the first driver of the first type, the second driver of the first type, and the additional driver of the first type.

Some instances of the method 800 and the apparatus described herein may further include operations, features, circuitry, logic, means, or instructions for identifying, based at least in part on fourth data stored within the memory array, a fourth logic state to indicate via the signal line using the driver, along with operations, features, circuitry, logic, means, or instructions for driving the signal line to a fourth voltage based at least in part on identifying the fourth logic state, where the fourth voltage may be representative of the fourth logic state, and where driving the signal line to the fourth voltage includes activating the first driver of the second type and the second driver of the second type concurrent with deactivating the first driver of the first type, the second driver of the first type, and the additional driver of the first type.

It should be noted that the methods described herein describe possible implementations, and that the operations and the steps may be rearranged or otherwise modified and that other implementations are possible. Further, portions from two or more of the methods may be combined.

An apparatus is described. The apparatus may include a memory array configured to store data and a driver coupled with the memory array and a signal line, where the driver is configured to transmit, via the signal line, signaling associated with three or more voltages and based at least in part on the data. The driver may include a set of one or more drivers of the second type, a set of one or more drivers of the first type including a same quantity of drivers as the set of one or more drivers of the second type, and an additional driver of the first type configured to be activated concurrently with at least one driver of the first type within the set of one or more drivers of the first type to drive the signal line to a voltage of the three or more voltages.

In some instances, the driver may be further configured to drive the signal line to the first voltage based at least in part on activating a first driver of the first type, drive the signal line to the second voltage based at least in part on activating a second driver of the first type, and drive the signal line to the voltage based at least in part on concurrently activating the first driver of the first type, the second driver of the first type, and the additional driver of the first type.

In some cases, the driver may be further configured to drive the signal line to the first voltage based at least in part on deactivating the second driver of the first type concurrent with activating the first driver of the first type and to drive the signal line to the second voltage based at least in part on deactivating the first driver of the first type concurrent with activating the second driver of the first type.

In some examples, the driver may further include a second additional driver of the first type, and the driver may be further configured to drive the signal line to the voltage based at least in part on activating the second additional driver of the first type concurrent with activating the first driver of the first type, the second driver of the first type, and the additional driver of the first type.

In some cases of the apparatus, the set of one or more drivers of the first type includes a first driver of the first type configured to have a first output resistance at a first voltage of the three or more voltages and a second driver of the first type configured to have a second output resistance at a second voltage of the three or more voltages.

In some examples, the set of one or more drivers of the second type may include a first driver of the second type configured to have the first output resistance at the second voltage of the three or more voltages and a second driver of the second type configured to have the second output resistance at the first voltage of the three or more voltages. The driver may be configured to drive the signal line to a fourth voltage of the three or more voltages based at least in part on activating the first driver of the second type and the second driver of the second type concurrent with deactivating the additional driver of the first type and each driver of the first type within the set of one or more drivers of the first type. In some instances, the driver may further be configured to drive the signal line to the first voltage based at least in part on activating the second driver of the second type and the first driver of the first type concurrent with deactivating the first driver of the second type, the second driver of the first type, and the additional driver of the first type. In some instances, the driver may further be configured to drive the signal line to the first voltage based at least in part on activating the first driver of the second type and the second driver of the first type concurrent with deactivating the second driver of the second type, the first driver of the first type, and the additional driver of the first type. In some instances, the driver may further be configured to drive the signal line to the first voltage based at least in part on deactivating the first driver of the second type and the second driver of the second type concurrent with activating the additional driver of the first type and each driver of the first type within the set of one or more drivers of the first type.

In some cases, the apparatus may further include logic circuitry coupled with the additional driver of the first type, the logic circuitry configured to activate the additional driver of the first type based at least in part on each driver of the first type of the set of one or more drivers of the first type being activated.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    calibrating a first driver of a first type at a first voltage, wherein the first driver of the first type is configured to drive a signal line to the first voltage;
    calibrating a second driver of the first type at a second voltage, wherein the second driver of the first type is configured to drive the signal line to the second voltage; and
    calibrating a third driver of the first type at a third voltage, wherein the third driver of the first type is configured to drive the signal line to the third voltage while the first driver of the first type and the second driver of the first type are activated,
    wherein the first driver of the first type is configured to drive the signal line to the first voltage while the second driver of the first type and the third driver of the first type are deactivated, and
    wherein the second driver of the first type is configured to drive the signal line to the second voltage while the first driver of the first type and the third driver of the first type are deactivated.

2. A method, comprising:
    calibrating a first driver of a first type at a first voltage, wherein the first driver of the first type is configured to drive a signal line to the first voltage;
    calibrating a second driver of the first type at a second voltage, wherein the second driver of the first type is configured to drive the signal line to the second voltage; and
    calibrating a third driver of the first type at a third voltage, wherein the third driver of the first type is configured to drive the signal line to the third voltage while the first driver of the first type and the second driver of the first type are activated, wherein calibrating the third driver of the first type comprises:
        coupling the third driver of the first type in parallel with the first driver of the first type and the second driver of the first type after calibrating the first driver of the first type and the second driver of the first type; and
        adjusting, while the third driver of the first type is coupled in parallel with the first driver of the first type and the second driver of the first type, and while the first driver of the first type and the second driver of the first type are activated, a strength code for the third driver of the first type until an output voltage of the third driver of the first type matches the third voltage.

3. A method, comprising:
    calibrating a first driver of a first type at a first voltage, wherein the first driver of the first type is configured to drive a signal line to the first voltage;
    calibrating a second driver of the first type at a second voltage, wherein the second driver of the first type is configured to drive the signal line to the second voltage;
    calibrating a third driver of the first type at a third voltage, wherein the third driver of the first type is configured to drive the signal line to the third voltage while the first driver of the first type and the second driver of the first type are activated; and calibrating a first driver of a second type at the second voltage while coupled with a first resistance, wherein:

calibrating the first driver of the first type comprises coupling the first driver of the first type with a second resistance, the second resistance based at least in part on the first driver of the second type being calibrated;

calibrating the second driver of the first type comprises coupling the second driver of the first type with a third resistance, the third resistance based at least in part on the first driver of the second type being calibrated; and calibrating the third driver of the first type comprises coupling the third driver of the first type with a fourth resistance, the fourth resistance based at least in part on the first driver of the second type being calibrated.

4. The method of claim 3, further comprising:

calibrating a second driver of the second type at the first voltage while coupled with a fifth resistance, the fifth resistance based at least in part on the second driver of the first type being calibrated.

5. The method of claim 3, wherein calibrating the first driver of the second type comprises:

coupling the first driver of the second type in series with a resistor having the first resistance; and adjusting, while the first driver of the second type is coupled with the resistor, a strength code for the first driver of the second type until a fourth voltage output by the first driver of the second type matches the second voltage.

6. The method of claim 3, wherein calibrating the first driver of the first type comprises:

coupling the first driver of the first type in series with a plurality of drivers of the second type, the plurality of drivers of the second type configured to collectively generate the second resistance based at least in part on being coupled in parallel, and the plurality of drivers of the second type each configured based at least in part on calibrating the first driver of the second type.

7. The method of claim 3, wherein calibrating the second driver of the first type comprises:

coupling the second driver of the first type in series with a plurality of drivers of the second type, the plurality of drivers of the second type configured to collectively generate the third resistance based at least in part on being coupled in parallel, and the plurality of drivers of the second type each configured based at least in part on calibrating the first driver of the second type.

8. The method of claim 3, wherein calibrating the third driver of the first type comprises:

coupling the third driver of the first type in parallel with the first driver of the first type and the second driver of the first type; and coupling the third driver of the first type in series with a plurality of drivers of the second type, the plurality of drivers of the second type configured to collectively generate the fourth resistance based at least in part on being coupled in parallel, the plurality of drivers of the second type each configured based at least in part on calibrating the first driver of the second type and a second driver of the second type.

9. A method, comprising:

calibrating a first driver of a first type at a first voltage, wherein the first driver of the first type is configured to drive a signal line to the first voltage;

calibrating a second driver of the first type at a second voltage, wherein the second driver of the first type is configured to drive the signal line to the second voltage;

calibrating a third driver of the first type at a third voltage, wherein the third driver of the first type is configured to drive the signal line to the third voltage while the first driver of the first type and the second driver of the first type are activated; and calibrating a fourth driver of the first type at the third voltage, wherein the fourth driver of the first type is configured to drive the signal line to the third voltage while the first driver of the first type, the second driver of the first type, and the third driver of the first type are activated, and wherein calibrating the fourth driver of the first type occurs concurrently with calibrating the third driver of the first type and comprises:

coupling the fourth driver of the first type in parallel with the first driver of the first type, the second driver of the first type, and the third driver of the first type.

10. An apparatus, comprising:

a memory array configured to store data; and a driver coupled with the memory array and a signal line, wherein the driver is configured to transmit, via the signal line, signaling associated with three or more voltages and based at least in part on the data, and wherein the driver comprises:

a set of one or more drivers of a first type;

a set of one or more drivers of a second type, wherein the set of one or more drivers of the first type comprises a same quantity of drivers as the set of one or more drivers of the second type; and an additional driver of the first type configured to be activated concurrently with at least one driver of the first type within the set of one or more drivers of the first type to drive the signal line to a voltage of the three or more voltages.

11. The apparatus of claim 10, wherein the driver is further configured to:

drive the signal line to a first voltage of the three or more voltages based at least in part on activating a first driver of the first type;

drive the signal line to a second voltage of the three or more voltages based at least in part on activating a second driver of the first type; and drive the signal line to the voltage based at least in part on concurrently activating the first driver of the first type, the second driver of the first type, and the additional driver of the first type.

12. The apparatus of claim 11, wherein the driver is further configured to:

drive the signal line to the first voltage based at least in part on deactivating the second driver of the first type concurrent with activating the first driver of the first type; and drive the signal line to the second voltage based at least in part on deactivating the first driver of the first type concurrent with activating the second driver of the first type.

13. The apparatus of claim 11, wherein the driver further comprises a second additional driver of the first type, and wherein the driver is further configured to:

drive the signal line to the voltage based at least in part on activating the second additional driver of the first type concurrent with activating the first driver of the first type, the second driver of the first type, and the additional driver of the first type.

14. The apparatus of claim 10, wherein the set of one or more drivers of the first type comprises:
  a first driver of the first type configured to have a first output resistance at a first voltage of the three or more voltages; and
  a second driver of the first type configured to have a second output resistance at a second voltage of the three or more voltages.

15. The apparatus of claim 14, wherein:
  the set of one or more drivers of the second type comprises:
    a first driver of the second type configured to have the first output resistance at the second voltage of the three or more voltages; and
    a second driver of the second type configured to have the second output resistance at the first voltage of the three or more voltages; and
  the driver is configured to:
    drive the signal line to a fourth voltage of the three or more voltages based at least in part on activating the first driver of the second type and the second driver of the second type concurrent with deactivating the additional driver of the first type and each driver of the first type within the set of one or more drivers of the first type;
    drive the signal line to the first voltage based at least in part on activating the second driver of the second type and the first driver of the first type concurrent with deactivating the first driver of the second type, the second driver of the first type, and the additional driver of the first type;
    drive the signal line to the second voltage based at least in part on activating the first driver of the second type and the second driver of the first type concurrent with deactivating the second driver of the second type, the first driver of the first type, and the additional driver of the first type; and
    drive the signal line to the voltage based at least in part on deactivating the first driver of the second type and the second driver of the second type concurrent with activating the additional driver of the first type and each driver of the first type within the set of one or more drivers of the first type.

16. The apparatus of claim 10, further comprising:
  logic circuitry coupled with the additional driver of the first type, the logic circuitry configured to activate the additional driver of the first type based at least in part on each driver of the set of one or more drivers of the first type being activated.

17. A method, comprising:
  identifying, based at least in part on first data stored within a memory array, a first logic state to indicate via a signal line using a driver, wherein the driver comprises a set of drivers of a first type and a set of drivers of a second type, the set of drivers of the first type comprising a same quantity of drivers as the set of drivers of the second type, and wherein the driver further comprises an additional driver of the first type;
  driving the signal line to a first voltage based at least in part on identifying the first logic state, wherein the first voltage is representative of the first logic state, and wherein driving the signal line to the first voltage comprises activating a first driver of the first type within the set of drivers of the first type concurrent with a second driver of the second type within the set of drivers of the second type;
  identifying, based at least in part on second data stored within the memory array, a second logic state to indicate via the signal line using the driver;
  driving the signal line to a second voltage based at least in part on identifying the second logic state, wherein the second voltage is representative of the second logic state, and wherein driving the signal line to the second voltage comprises activating a second driver of the first type within the set of drivers of the first type concurrent with a first driver of the second type within the set of drivers of the second type;
  identifying, based at least in part on third data stored within the memory array, a third logic state to indicate via the signal line using the driver; and
  driving the signal line to a third voltage based at least in part on identifying the third logic state, wherein the third voltage is representative of the third logic state, and wherein driving the signal line to the third voltage comprises activating the first driver of the first type and the second driver of the first type concurrent with the additional driver of the first type.

18. The method of claim 17, wherein:
  driving the signal line to the first voltage further comprises deactivating the second driver of the first type and the first driver of the second type concurrent with activating the first driver of the first type and the second driver of the second type;
  driving the signal line to the second voltage further comprises deactivating the first driver of the first type and the second driver of the second type concurrent with activating the second driver of the first type and the first driver of the second type; and
  driving the signal line to the third voltage further comprises deactivating the first driver of the second type and the second driver of the second type concurrent with activating the first driver of the first type, the second driver of the first type, and the additional driver of the first type.

19. The method of claim 17, further comprising:
  identifying, based at least in part on fourth data stored within the memory array, a fourth logic state to indicate via the signal line using the driver; and
  driving the signal line to a fourth voltage based at least in part on identifying the fourth logic state, wherein the fourth voltage is representative of the fourth logic state, and wherein driving the signal line to the fourth voltage comprises activating the first driver of the second type and the second driver of the second type concurrent with deactivating the first driver of the first type, the second driver of the first type, and the additional driver of the first type.

* * * * *